(12) United States Patent  
Nakamura et al.

(10) Patent No.: US 10,903,099 B2
(45) Date of Patent: Jan. 26, 2021

(54) SEMICONDUCTOR WAFER PLACEMENT POSITION DETERMINATION METHOD AND SEMICONDUCTOR EPITAXIAL WAFER PRODUCTION METHOD

(71) Applicant: SUMCO CORPORATION, Tokyo (JP)

(72) Inventors: Ikuhiro Nakamura, Tokyo (JP); Keiichi Takanashi, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 125 days.

(21) Appl. No.: 16/204,353

(22) Filed: Nov. 29, 2018

(65) Prior Publication Data

US 2019/0172739 A1   Jun. 6, 2019

(30) Foreign Application Priority Data

Dec. 1, 2017   (JP) .................... 2017-231557

(51) Int. Cl.
  *H01L 21/67*   (2006.01)
  *H01L 21/66*   (2006.01)
  (Continued)

(52) U.S. Cl.
  CPC .. *H01L 21/67259* (2013.01); *H01L 21/67718* (2013.01); *H01L 21/68* (2013.01); *H01L 21/68735* (2013.01); *H01L 22/34* (2013.01)

(58) Field of Classification Search
  CPC ......... H01L 21/67259; H01L 21/67718; H01L 21/68; H01L 21/68735; H01L 22/34
  (Continued)

(56) References Cited

U.S. PATENT DOCUMENTS 9,250,196 B2    2/2016  Okabe et al.
2018/0135166 A1  5/2018  Sakurai
2018/0135172 A1  5/2018  Nogami et al.

FOREIGN PATENT DOCUMENTS

JP    2007-294942 A     11/2007
JP    2007294942 A  *  11/2007
(Continued)

OTHER PUBLICATIONS

Office Action issued in Japan family member Patent Appl. No. 2017-231557, dated Nov. 13, 2018, along with an English translation thereof.

*Primary Examiner* — Jigneshkumar C Patel
(74) *Attorney, Agent, or Firm* — Greenblum & Bernstein, P.L.C.

(57) ABSTRACT

Provided is a semiconductor wafer placement position determination method making it possible to measure a position deviation at a placement position of a semiconductor wafer when using a susceptor that is N-fold symmetric with respect to the center of the susceptor as a rotation axis. In this method, an opening edge of a counterbore portion of the susceptor is N-fold symmetric with respect to the center of the susceptor as a rotation axis ($N \geq 2$). This method includes: a measurement step of measuring, while rotating the susceptor on which the semiconductor wafer is placed, a gap distance between a periphery of the semiconductor wafer and the opening edge; a first calculation step of performing, based on variation of the gap distance, period regression analysis; and a second calculation step of determining the position deviation based on an amplitude of a trigonometric function obtained by the first calculation step.

6 Claims, 24 Drawing Sheets

(51) Int. Cl.
  *H01L 21/68* (2006.01)
  *H01L 21/677* (2006.01)
  *H01L 21/687* (2006.01)

(58) Field of Classification Search
  USPC .......................................................... 700/186
  See application file for complete search history.

(56) References Cited

FOREIGN PATENT DOCUMENTS

| | | | |
|---|---|---|---|
| JP | 2014-154565 A | | 8/2014 |
| JP | 2016-213218 A | | 12/2016 |
| JP | 2016213218 A | * | 12/2016 |

\* cited by examiner

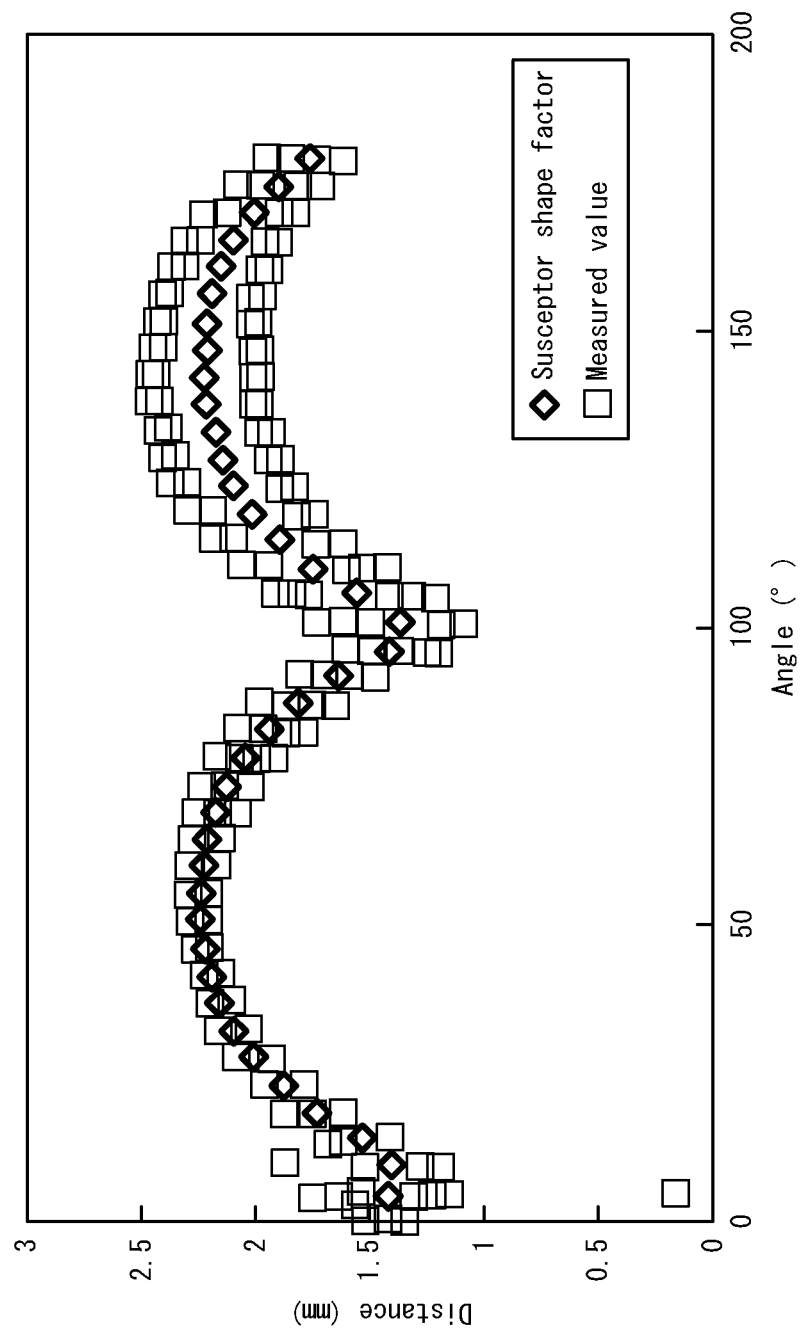

SEMICONDUCTOR WAFER PLACEMENT POSITION DETERMINATION METHOD AND SEMICONDUCTOR EPITAXIAL WAFER PRODUCTION METHOD

TECHNICAL FIELD

This disclosure relates to a method of determining semiconductor wafer placement position and a method of producing a semiconductor epitaxial wafer.

BACKGROUND

Silicon wafers are widely used as semiconductor wafers. In general, in order to obtain a silicon wafer, single crystal silicon is grown by Czochralski or CZ method, etc., and the single crystal silicon is cut into blocks, then sliced thin, subjected to a flat surface grinding or lapping step, an etching step, and a mirror surface polishing or polishing step, and finally cleaning. Such a silicon wafer is then shipped as a product if various quality inspections observe no abnormality.

Here, for example when crystal integrity is further required, when a multi-layer structure having layers of different resistivity is needed, an epitaxial wafer is produced by growing an epitaxial wafer formed of a single crystal silicon thin film on a surface of the silicon wafer by vapor phase growth or epitaxial growth. Further, epitaxial growth is widely performed on compound semiconductor wafers of SiC, GaAs, etc. besides silicon wafers.

FIG. 1 depicts a typical epitaxial growth apparatus 150 used to form an epitaxial layer on a semiconductor wafer W formed of a silicon wafer. This epitaxial growth apparatus 150 includes an upper liner 151 and a lower liner 152 for maintaining the airtightness, and an upper dome 153 and a lower dome 154 define an epitaxial growth reactor. Further, a measurement unit 155 for measuring the length of a gap between a periphery of the semiconductor wafer W or a wafer edge and an opening edge of a susceptor 1 is provided in the epitaxial growth apparatus 150. Further, the susceptor 1 for horizontally placing the semiconductor wafer NV is provided inside the epitaxial growth reactor.

The susceptor 1, which is a typical conventionally known one, is described with reference to FIG. 2A. When performing epitaxial growth, the semiconductor wafer W is placed on a counterbore portion 11 of the susceptor 1, and a growth gas or a source gas is blown onto the surface of the semiconductor wafer W while rotating the susceptor 1. FIGS. 2A and 2B are schematic views of a plan view and a cross-sectional view of the susceptor 1 taken along line A-A. Here, the susceptor 1 is provided with a circular concave counterbore portion 11, and the semiconductor water W is placed so that the center of the semiconductor wafer W is aligned with the center of the counterbore portion 11. The semiconductor wafer W is in contact with the susceptor 1 on the ledge portion 11L. Here, in FIGS. 2A and 2B, a radial distance L between the center of the susceptor 1 and the opening edge 11C of the counterbore portion 11 is constant in the circumferential direction. Accordingly, a gap distance $L_p$ between the radially outer end surface of the semiconductor wafer W and an inner circumferential wall surface 11A, which is also called a pocket width, is also constant in the circumferential direction. Therefore, the opening edge 11C describes a circle when the susceptor 1 is viewed from above.

Here, FIG. 2A illustrates a state where the center Cw of the semiconductor wafer W coincides with the center Cs of the susceptor (since both the centers overlap, they are not indicated by reference numerals). In practice, when the semiconductor wafer W is placed on the susceptor 1, a transfer robot etc. is used, and the semiconductor wafer W is raised or lowered using a lift pin (not shown) for the placement. Further, since the temperature inside the epitaxial growth reactor is high, the semiconductor wafer would be warped. For these reasons, as illustrated in an exaggerated manner in FIG. 2B, it is difficult to make the center Cw of the semiconductor wafer W and the center Cs of the susceptor coincide, and the positions of the centers would deviate from each other. The distance between the center Cw of the semiconductor wafer W and the center Cs of the susceptor that are misaligned is hereinafter referred to as a position deviation G. For the reasons described above, the position deviation G is typically around several micrometers to several hundred micrometers.

An excessively large position deviation G would result in periodic variation of the film thickness profile of the epitaxial layer formed. In terms of addressing this problem, a technique for measuring a position deviation G and controlling the position deviation G of the subsequent epitaxial growths based on the measurement result is known. In order to measure the position deviation G, for example, as illustrated in FIG. 3A, the gap distance $L_p$ between the radially outer end surface of the semiconductor wafer W and the opening edge 11A is measured using the measurement unit 155 of the epitaxial growth apparatus 150, and the position deviation G is measured based on variation of the gap distance $L_p$ (for example, see JP 2014-154565 A (PTL 1)). Since the semiconductor wafer W has a circular shape, as illustrated in FIG. 3B, the gap distance $L_p$ does not vary if no position deviation is observed on the other hand, when a position deviation is observed, the gap distance $L_p$ varies as a periodic function which is a trigonometric function. Therefore, the position deviation G can be obtained from the amplitude of the trigonometric function.

As illustrated in FIG. 4, in a silicon wafer having a main surface which is a {100} plane, a <110> direction and a <100> direction are alternately repeated every 45°. Due to this periodicity of the crystal orientation, when a silicon epitaxial layer is grown on a surface of the silicon wafer, an epitaxial layer is grown at different growth rates at 90° periods (referred to as "growth rate orientation dependence"). The thickness of the epitaxial layer greatly changes in the circumferential direction with due to such difference of growth rates depending on the crystal orientation, and the effect is larger in a wafer edge area or a wafer outer circumferential area. Accordingly, the growth rate orientation dependence is known as a cause of lower flatness of epitaxial wafers.

This being the case, JP 2007-294942 A (PTL 2) proposes a susceptor of which structure and/or shape changes periodically according to the change of crystal orientation of the semiconductor wafer in the vicinity of the inner circumferential surface of the susceptor opening. In particular, PTL 2 describes that the structure or shape of this susceptor is preferably changed periodically by periodically changing the pocket width, i.e., "gap distance", of the susceptor at 90°, 180°, or 270° periods.

As described in PTL 2, a wider gap distance of the susceptor (see FIG. 5C to be described below) allows a silicon source gas to be smoothly supplied to the periphery of the silicon wafer, which increases the growth rate of the epitaxial layer at the periphery. By contrast, a smaller gap distance of the susceptor (see FIG. 5B to be described) causes an opposite phenomenon resulting in a lower growth rate.

As a susceptor according to the technique of PTL 2, a susceptor 100 as illustrated in FIG. 5A is given as an example, in which the opening edge 110C of the counterbore portion 119 describes four circular arcs when the susceptor 100 is viewed from above. FIG. 5B is a cross-sectional view of FIG. 5A taken along line B-B, and FIG. 5C is a cross-sectional view of FIG. 5A taken along line C-C. The susceptor 100 illustrated both in FIG. 5B and FIG. 5C allow the gap distance $L_p$ to be periodically changed from $L_{p1}$ to $L_{p2}$ according to the change of the crystal orientation of the silicon wafer, thus the growth rate orientation dependence in epitaxial growth can be reduced. As a result, performing epitaxial growth using the susceptor 100 can reduce the growth rate orientation dependence of the epitaxial layer, which improves the film thickness profile of the epitaxial layer.

CITATION LIST

Patent Literature

PTL 1: JP 2014-154565 A
PTL 2: JP 2007-294942 A

In the case of a concentric circular susceptor in which the opening edge 11C depicted in FIG. 2A is circular and the center of the opening edge 11C agrees with the center of the susceptor 1, the position deviation G can be measured by the technique disclosed in PTL 1. However, even if this technique is applied to a susceptor having a shape in which the radial distance L from the center of the susceptor 100 to the opening edge 1100 periodically changes (N-fold symmetric with respect to the center of the susceptor as a central axis, 4-fold symmetric in the susceptor depicted in FIG. 5A) as disclosed in PTL 2, the position deviation G cannot be determined.

In practice, we considered determining the position deviation G in the case of using the susceptor 100 depicted in FIG. 5A and we only obtained a graph of the gap distance $L_p$ as presented in FIG. 6. Note that a home signal also depicted in FIG. 6 is a signal for detecting a notch position (or the position of an orientation flat) of the semiconductor wafer W. One rotation (360° in the circumferential direction) of the semiconductor wafer can be examined by two detected adjacent home signals.

It could therefore be helpful to provide a method of determining a semiconductor wafer placement position, by which the position deviation of the placement position of a semiconductor wafer can be measured when using a susceptor which is N-fold symmetric with respect to the center of the susceptor as a rotation axis. Further, it could also be helpful to provide a semiconductor epitaxial wafer production method using this method of determining a semiconductor wafer placement position.

We have made intensive studies to solve the above problems. When the gap distance $L_p$ is measured using an N-fold symmetric susceptor, the gap distance $L_p$ illustrated in FIG. 6 varies periodically. We considered this is based on (i) variation resulting from position deviation, which variation is in accordance with a trigonometric function with a 360° rotation period of the susceptor being 1 period and (ii) a swell component of $(360/N)°$ periods, which is a susceptor shape factor. After considering these factors, we found that if the variation according to a trigonometric function resulting from position deviation can be extracted from the measured gap distance $L_p$ the position deviation can be obtained using the amplitude of the trigonometric function. This discovery led to this disclosure. This disclosure completed based on the above findings primarily includes the following features.

<1> A semiconductor wafer placement position determination method of measuring a position deviation of a center of a semiconductor wafer from a center of a susceptor that is disposed in an epitaxial growth apparatus and is provided with a concave counterbore portion and with an inner circumferential wall surface, the semiconductor wafer being placed in the counterbore portion of the susceptor, wherein a radial distance between the center of the susceptor and an opening edge of the counterbore portion varies in the circumferential direction, and the opening edge of the counterbore is N-fold symmetric with respect to the center of the susceptor as a rotation axis, where N is an integer equal to or more than 2, the semiconductor wafer placement position determination method comprises:

a measurement step of measuring, while rotating at least once the susceptor on which the semiconductor wafer is placed, a gap distance between a periphery of the semiconductor wafer at a predetermined position in the circumferential direction and the opening edge;

a first calculation step of performing, based on variation of the gap distance obtained by the measurement step, period regression analysis in which a rotation period of the susceptor is 1 period; and a second calculation step of determining the position deviation based on an amplitude of a trigonometric function obtained by the first calculation step.

<2> The semiconductor wafer placement position determination method according to <1> above, wherein in the first calculation step, a correction gap distance is obtained by subtracting a susceptor shape factor resulting from the variation of the radial distance from the variation of the gap distance, and the period regression analysis is performed based on the correction gap distance instead of the gap distance.

<3> The semiconductor wafer placement position determination method according to <2> above, wherein the number N is an even number, and the susceptor shape factor is obtained from an average of the gap distances of 180° periods.

<4> The semiconductor wafer placement position determination method according to <2> above, wherein the susceptor shape factor is obtained based on a design value or a measured value of a shape of the susceptor.

<5> A semiconductor epitaxial wafer production method, comprising the steps of:

determining the position deviation using the semiconductor wafer placement position determination method according to any one of <1> to <4> above:

adjusting the placement position of the semiconductor wafer so that the obtained position deviation is fed back so that the position deviation is reduced, placing another semiconductor wafer at the adjusted placement position, and forming an epitaxial layer on a surface of the another semiconductor wafer using the epitaxial growth apparatus.

This disclosure provides a semiconductor wafer placement position determination method which makes it possible to measure a position deviation at a placement position of a semiconductor wafer when using a susceptor having an opening edge with a counterbore that is N-fold symmetric with respect to the center of the susceptor as a rotation axis.

Further, this disclosure provides a semiconductor epitaxial wafer production method using this semiconductor wafer placement position determination method.

BRIEF DESCRIPTION OF THE DRAWINGS

In the accompanying drawings:

FIG. 10B depicts a periodic function of a susceptor shape factor obtained in Example 1;

DETAILED DESCRIPTION

Figure 7:
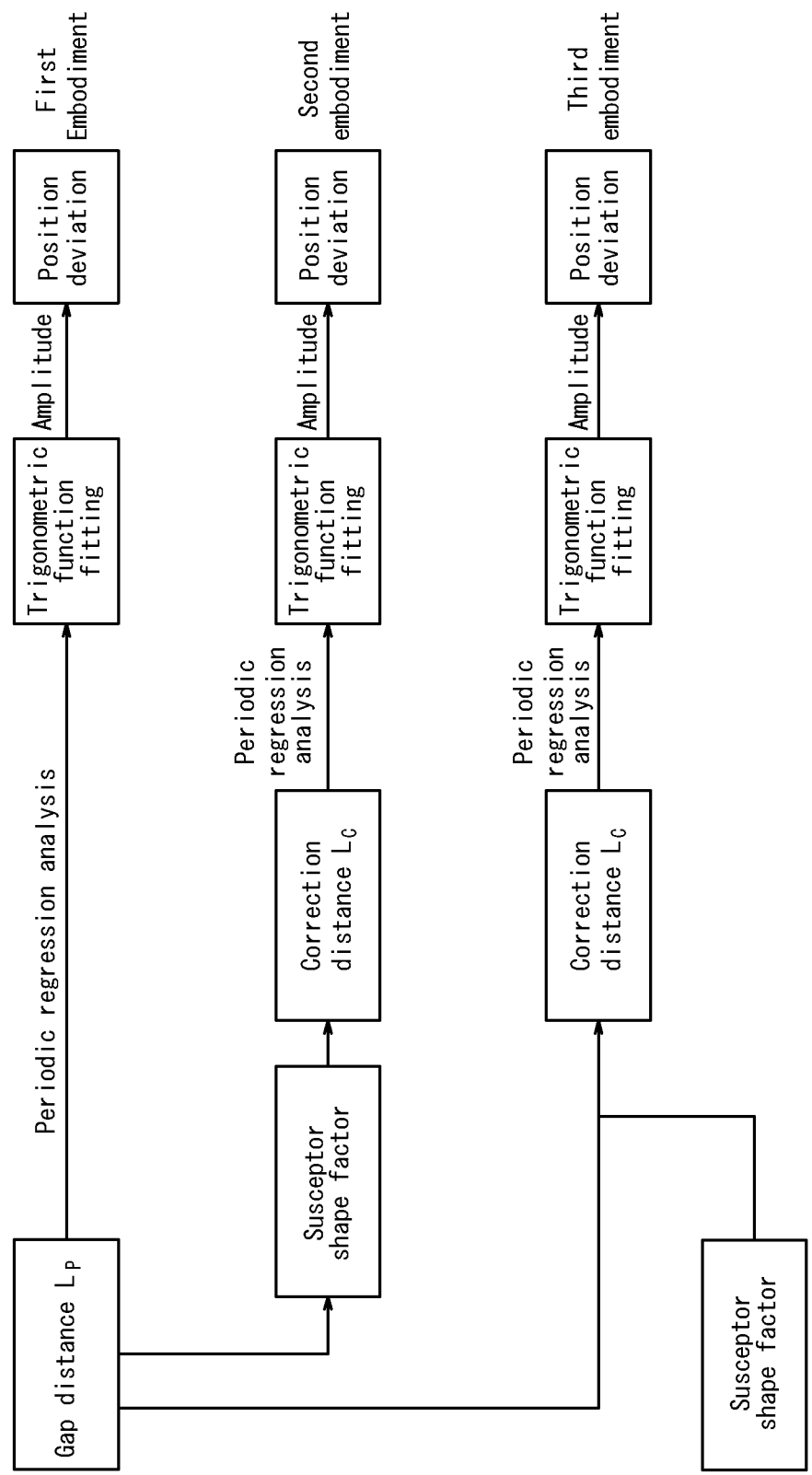
FIG. 7 is a block diagram depicting the correlation between first to third embodiments of this disclosure.

A semiconductor wafer placement position determination method according to this disclosure and a method of producing a semiconductor epitaxial wafer using the same will now be described with reference to FIG. 7 to FIG. 9B. FIG. 7 is a block diagram illustrating the correlation between the first to third embodiments of this disclosure. The description begins with the first embodiment, followed by the second embodiment and the third embodiment in this order.

Note that it should readily be understood that the terms "period", "angle", "symmetric", and "constant" are not required to be strict in mathematical and geometric senses.

Semiconductor Wafer Placement Position Determination Method of First Embodiment A method of determining a placement position of a semiconductor wafer W according to the first embodiment will be described with reference to the reference numerals in FIG. 1, FIG. 2B, and FIGS. 5A to 5C described above. In the method of determining the placement position of the semiconductor wafer W according to this embodiment, a position deviation G of the center Cw of the semiconductor wafer W from the center Cs of a susceptor 100 that is disposed in an epitaxial growth apparatus 150 and is provided with a concave counterbore portion 110 and with an inner circumferential wall surface 110A is measured, the semiconductor wafer being placed in the counterbore portion 110 of the susceptor 100. Here, in the susceptor 100 used in this embodiment, a radial distance L between the center Cs and an opening edge 110C of the counterbore portion 110 varies in the circumferential direction, and the opening edge 110C of the counterbore portion 110 of the susceptor 100 has an N-fold symmetric shape with respect to the center Cs of the susceptor 100 as a rotation axis (where N is an integer equal to or more than 2).

Further, the method of determining a placement position of the semiconductor wafer W according to this embodiment includes a measurement step of measuring, while rotating at least once the susceptor 100 on which the semiconductor wafer W is placed, a gap distance $L_p$ between a radially outer end surface of the semiconductor wafer W at a predetermined position in the circumferential direction and the opening edge 110C; a first calculation step of performing, based on variation of the gap distance $L_p$ obtained by the measurement step, period regression analysis in which a rotation period of the susceptor 100 is 1 period; and a second calculation step of obtaining the position deviation G based on an amplitude of a trigonometric function obtained by the first calculation step. These steps will be sequentially described in detail below.

In this embodiment, with the semiconductor wafer W being placed on the susceptor 100 in the epitaxial growth apparatus 150, the gap distance $L_p$ between a radially outer end surface of the semiconductor wafer W at a predetermined position in the circumferential direction and the opening edge 110C is measured while rotating the susceptor 100. Note that the semiconductor wafer W is inevitably rotated as the susceptor 100 is rotated. This measurement step can use a measurement unit 155 which can be installed in the epitaxial growth apparatus 150, and the measurement unit 155 includes an imaging unit, for example a CCD camera, and an image analysis unit for analyzing variation of the distance between two objects (for example, the semiconductor wafer W) in a given direction based on images taken using the imaging unit. The measurement unit 155 may use a typical CCD camera or a typical line sensor. The measurement may be performed while a source gas for performing epitaxial growth is blown onto the semiconductor wafer W; however, the measurement is not necessarily performed while epitaxial growth is performed, and variation of the gap distance $L_p$ can be measured while rotating the susceptor 100. The susceptor 100 is rotated at least once (1 period) in the circumferential direction, and the rotation may be performed more than once. In order to increase the accuracy of the analysis of the period regression analysis in the next step, measurement results of a plurality of rotations are preferably acquired.

Next, based on the variation of the gap distance $L_p$ obtained in the measurement step, the first calculation step of performing period regression analysis in which the rotation period of the susceptor 100 is 1 period is performed. This first calculation step can perceive (i) variation resulting from the position deviation between the centers: the center Cw of the semiconductor wafer W and the center Cs of the susceptor, which variation is in accordance with a trigonometric function with a 360° rotation period of the susceptor 100 being 1 period. In the period regression analysis, fitting may be performed with the trigonometric function with the 360° rotation period of the susceptor 100 being 1 period, and the amplitude of the trigonometric function obtained is used in the subsequent second step. In a 360° rotation period of the susceptor 100, a signal detected as a position of a notch or orientation flat position of the semiconductor wafer W may be detected using the measurement unit 155 and the measurement time may be converted into a rotation angle. Of course, the above trigonometric function can be obtained directly from the measurement time taking the rotation speed of the susceptor into account without the conversion into a rotation angle. Note that in the fitting with trigonometric functions, the least square method is used for the approximation to the trigonometric function, and the calculation is performed for example as follows.

A measured value of the gap distance for the susceptor having the above-described N-fold symmetric opening edge (between the periphery of the wafer and the opening edge of the susceptor) is obtained by adding a signal represented by the trigonometric function TMS(θ) of one period or one rotation of the susceptor, resulting from the placement position deviation, to a function of the shape of the susceptor. Accordingly, the gap distance Gap can be expressed as a function of the phase θ(°) as represented by the following formula [1]. In this formula, "A" is the amplitude of the placement position deviation, and α is the phase difference of the placement position deviation.

$$\text{Gap}(\theta) = A\sin(\theta + \alpha) + TMS(\theta) \quad [1]$$

Here, when the susceptor is for example 4-fold symmetric, TMS(θ) is symmetric with respect to 90° rotations as in the following formula [2].

$$TMS(\theta) = TMS(\theta + 90 \times n) \quad [2]$$

where n is an integer.

Here, the relationship between Gap(θ) and TMS(θ) can be obtained from the following calculation.

$$\text{Gap}(\theta) + \text{Gap}(\theta + 180) = A\sin(\theta + \alpha) + TMS(\theta) +$$
$$A\sin(\theta + 180 + \alpha) + TMS(\theta + 180)$$
$$= A\sin(\theta + \alpha) + TMS(\theta) -$$
$$A\sin(\theta + \alpha) + TMS(\theta)$$
$$= 2TMS(\theta)$$
$$\therefore TMS(\theta) = (\text{Gap}(\theta) + \text{Gap}(\theta + 180))/2$$

Accordingly, a component of the deviation of the placement position is calculated from the following formula [3]. Thus, the amplitude and phase difference can be calculated from this formula [3].

$$A\sin(\theta + \alpha) = \text{Gap}(\theta) - TMS(\theta) \quad [3]$$

The above formulae [1] to [3] are drawn only from the formula of a trigonometric function and the symmetry of the susceptor shape and therefore hold with respect any angle.

In the second calculation step, the position deviation G is sought based on the amplitude of the trigonometric function obtained by the first calculation step. The amplitude of the trigonometric function itself may be handled as the position deviation G; more preferably, a correction value may be calculated by adding or subtracting a certain value from/to the position deviation G, and this correction value may then be handled as the position deviation G.

Figure 6:
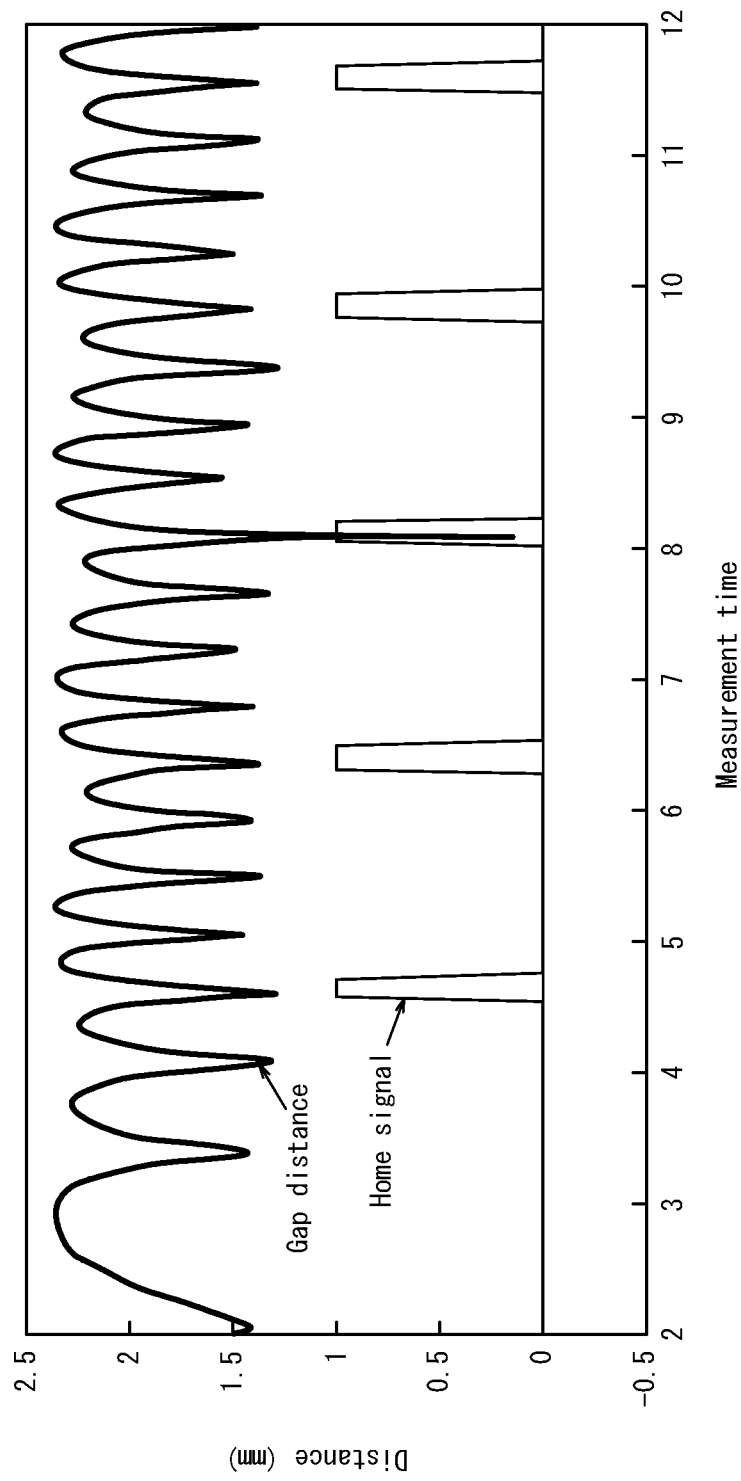
FIG. 6 is a graph depicting variation of the gap distance measured when using a 4-fold susceptor illustrated in FIG. 5A.
Figure 8:
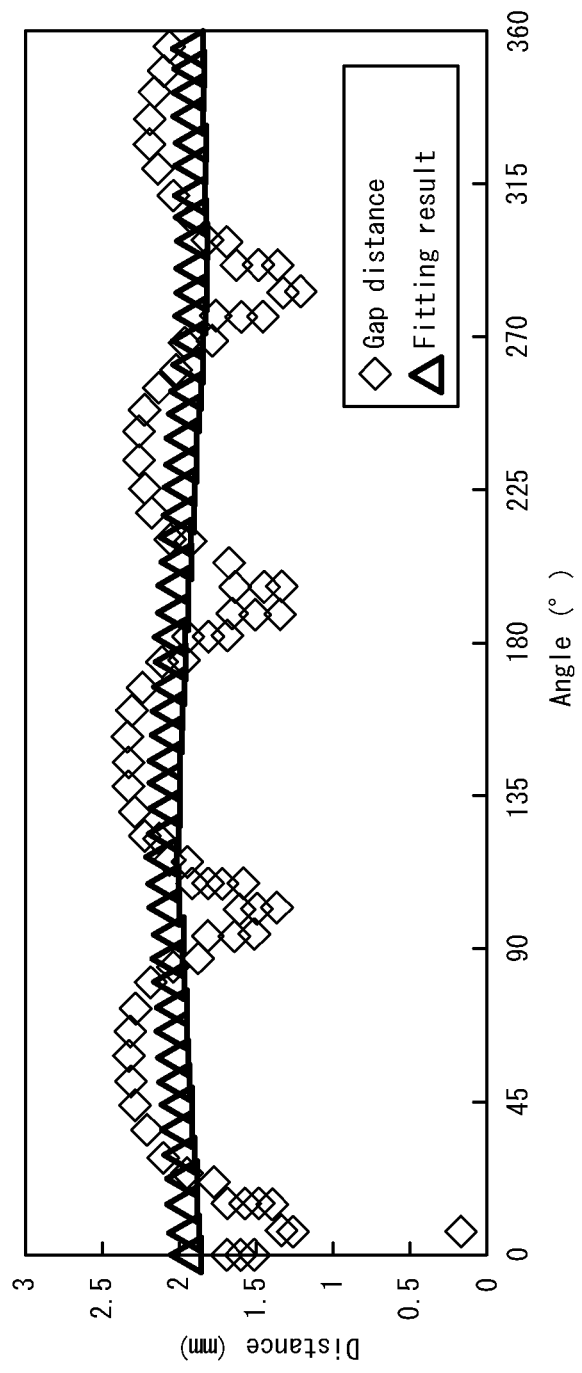
FIG. 8 is an example illustrating a trigonometric function obtained according to the first embodiment.

FIG. 8 is a graph depicting an example of a trigonometric function obtained in the first embodiment in the case where the 4-fold symmetric susceptor 100 described above is used. Since the radial distance L from the center of the susceptor 100 to the opening edge 110C periodically varies at 90° periods, which makes the gap distance $L_p$ seem to also vary at 90° periods. In FIG. 6, the measurement time is converted into a rotation angle of the susceptor. In this first embodiment, when the trigonometric functions resulting from the position deviation between the centers: the center Cw and the center Cs is extracted, since the amplitude is 86.87 μm, the position deviation G of the gap distance $L_p$ is also determined to be 86.87 μm.

Figure 1:
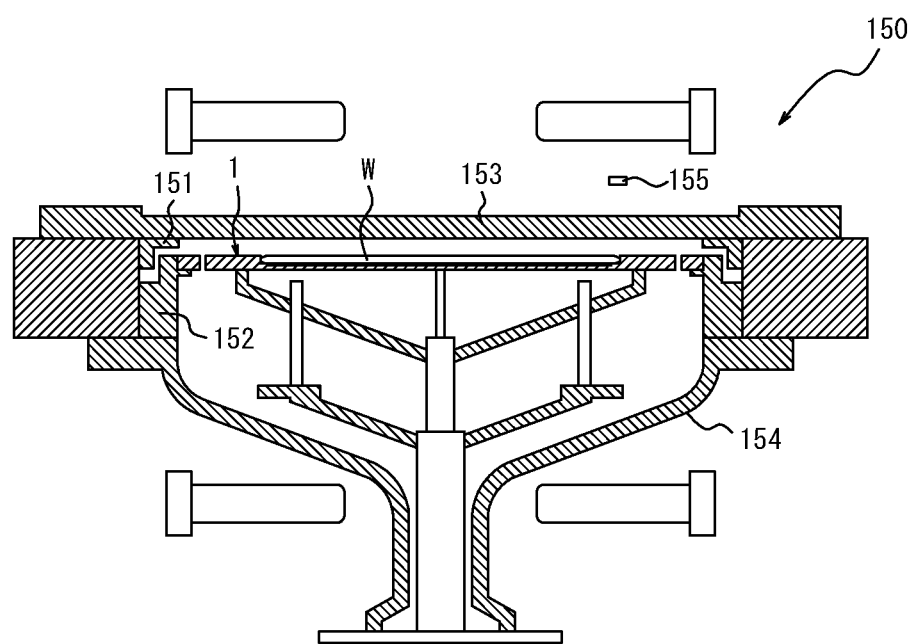
FIG. 1 is a schematic cross-sectional view of a typical conventionally known epitaxial growth apparatus.
Figure 2A:
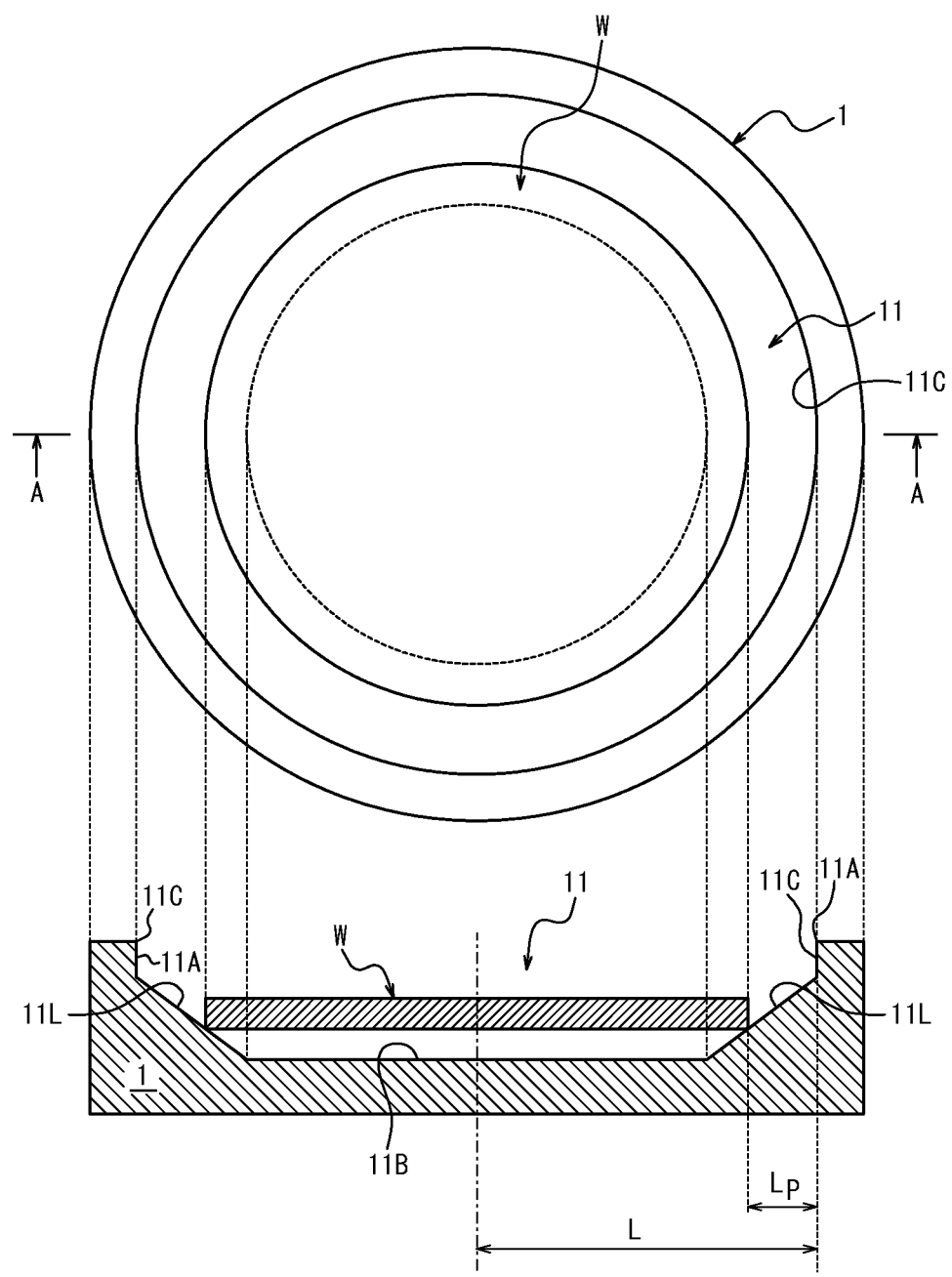
FIG. 2A depicts a schematic cross-sectional view of a typical conventionally known epitaxial susceptor and a cross-sectional view thereof taken along line A-A.
Figure 2B:
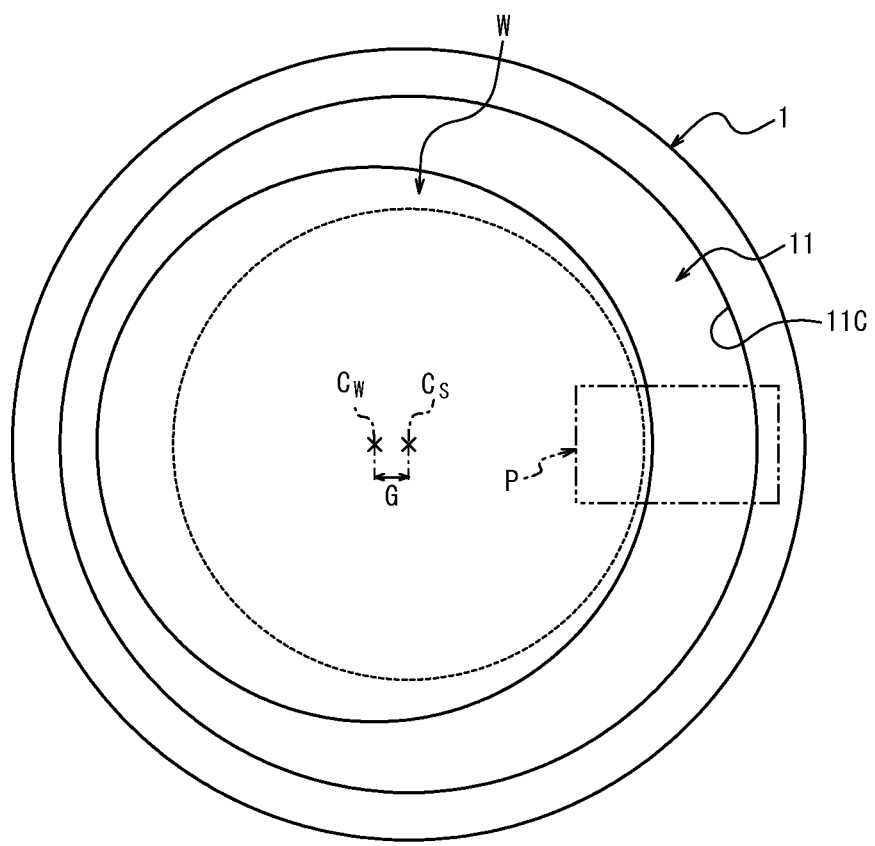
FIG. 2B is a schematic cross-sectional view illustrating, in an exaggerated manner, a state where the center of a semiconductor wafer is positionally deviated from the center of the susceptor in FIG. 2A.
Figure 3A:
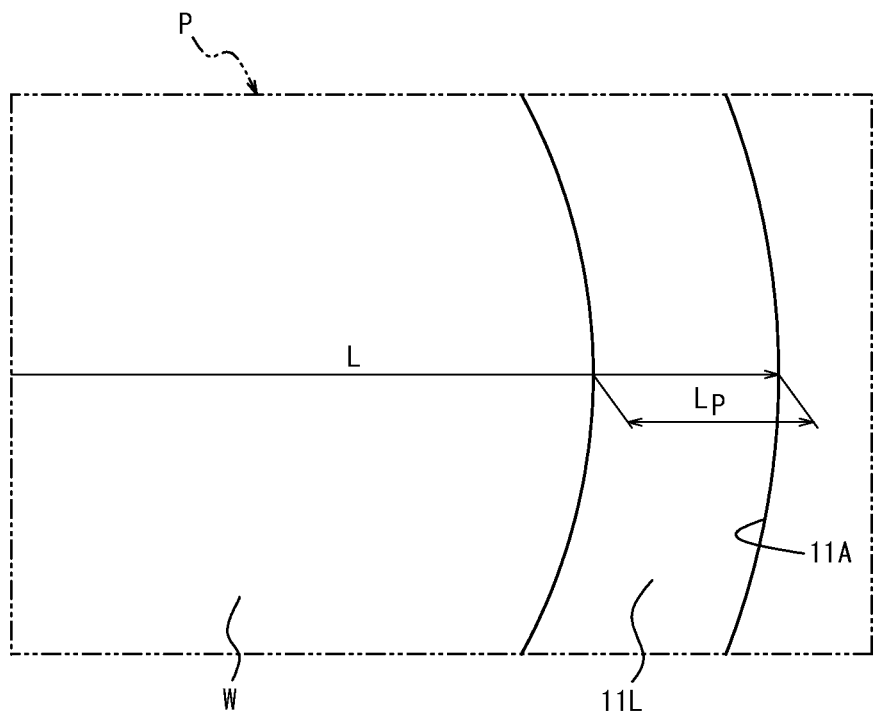
FIG. 3A is an enlarged cross-sectional view of the P region in FIG. 2B.
Figure 3B:
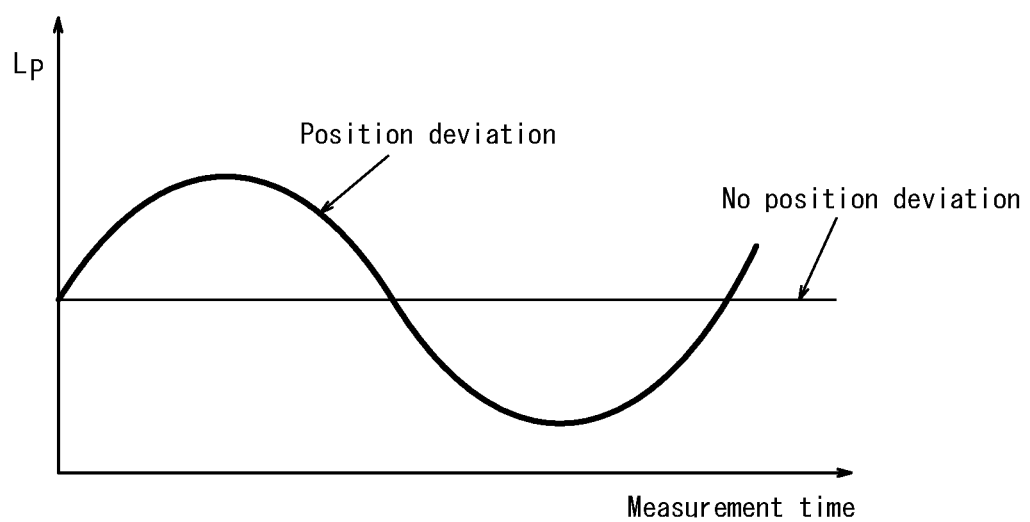
FIG. 3B is a schematic graph depicting variation of the gap distance when a susceptor is rotated.
Figure 4:
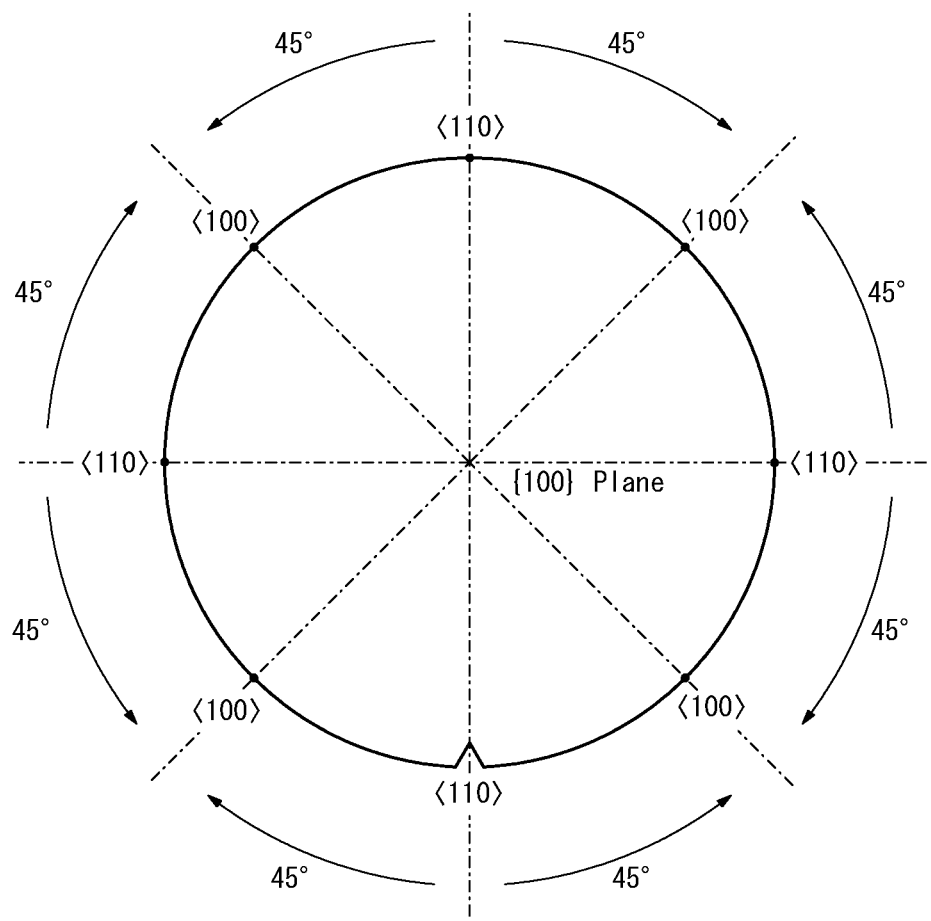
FIG. 4 is a schematic view illustrating the crystal orientation of a silicon wafer having a main surface of a {100} plane.
Figure 5A:
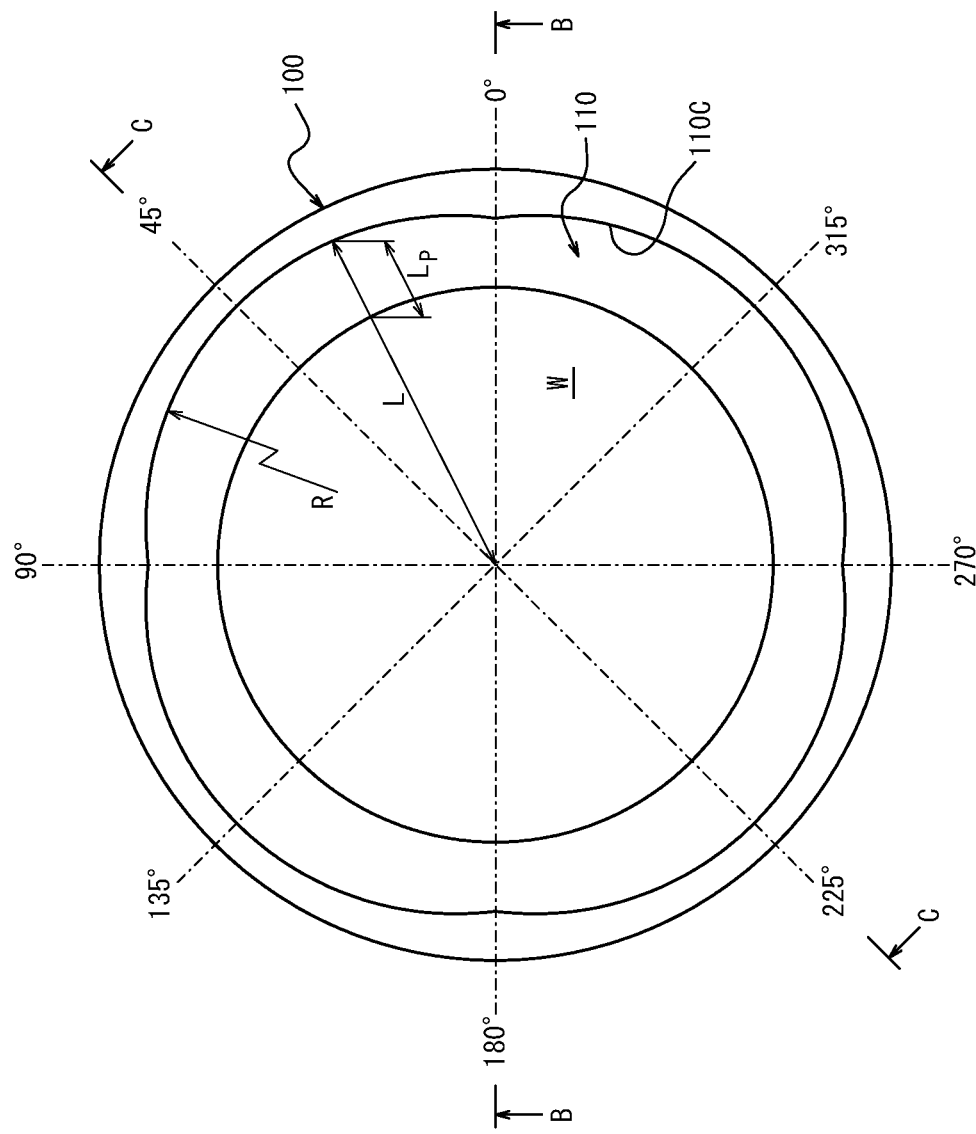
FIG. 5A is a schematic plan view of a 4-fold symmetric susceptor in which an opening edge of a counterbore portion describes four circular arcs.
Figure 5B:
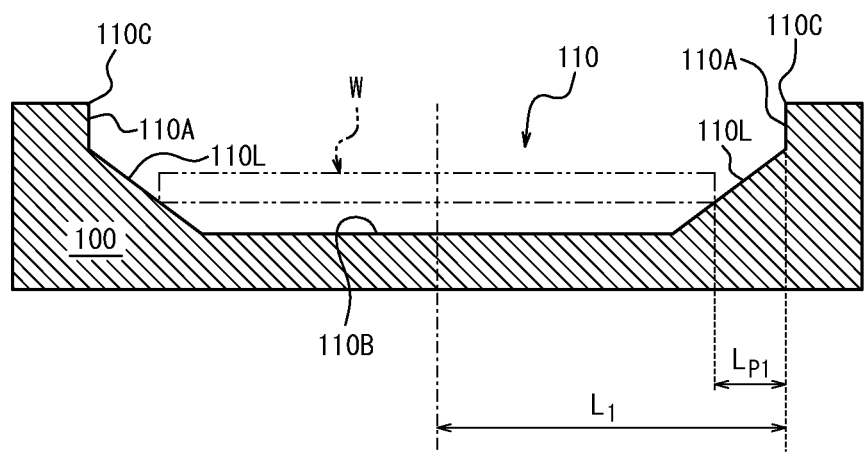
FIG. 5B is a cross-sectional view of FIG. 5A taken along line B-B.
Figure 5C:
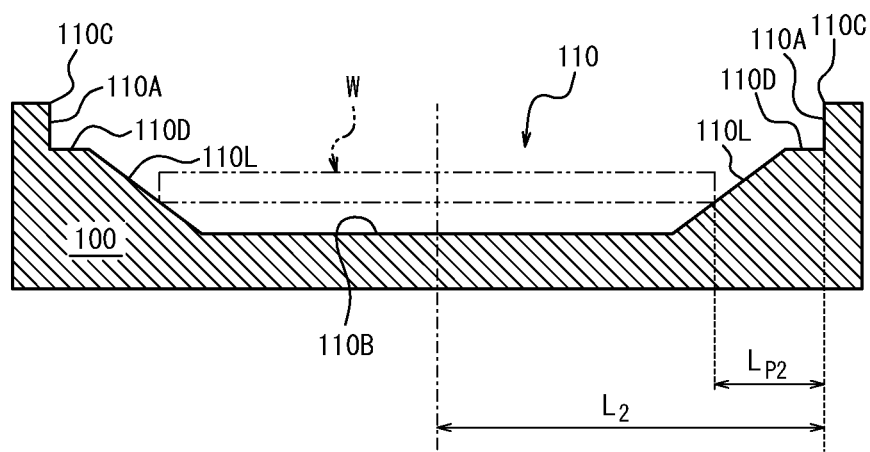
FIG. 5C is a cross-sectional view of FIG. 5A taken along line C-C.

Note that in the susceptor 100, the above-described radial distance L between the center Cs of the susceptor 100 and the opening edge 110C of the counterbore portion 110 varies in the circumferential direction, and the opening edge 110C of the counterbore portion 110 in the susceptor 100 has an N-fold symmetric shape with respect to the center Cs of the susceptor 100 as a rotation axis (where N is an integer equal to or more than 2). The shape depicted in FIG. 5A to FIG. 5C is only an example, and when the susceptor 100 is viewed from above, the contour of the opening edge may constitute a plurality of circular arcs, may constitute elliptic arcs, may constitute parabolas, or may have a given curved shape. Alternatively, the contour of the opening edge 110C when viewed from above may have a regular polygonal shape. This embodiment can be applied to a susceptor having an N-fold symmetric shape, where N is a given number. Note that N is an integer equal to or more than 2 as described above; for example, 2-fold symmetry, 3-fold symmetry, 4-fold symmetry, 6-fold symmetry, and 8-fold symmetry are possible.

Further, in the first calculation step in this embodiment, a correction gap distance $L_c$ may be sought by subtracting the susceptor shape factor resulting from variation of the radial distance L from the gap distance $L_p$, and period regression analysis may be performed based on the correction gap distance Lc instead of the gap distance $L_p$. The second embodiment and the third embodiment in the case of seeking the position deviation G based on this correction gap distance Lc will be described below.

Figure 9A:
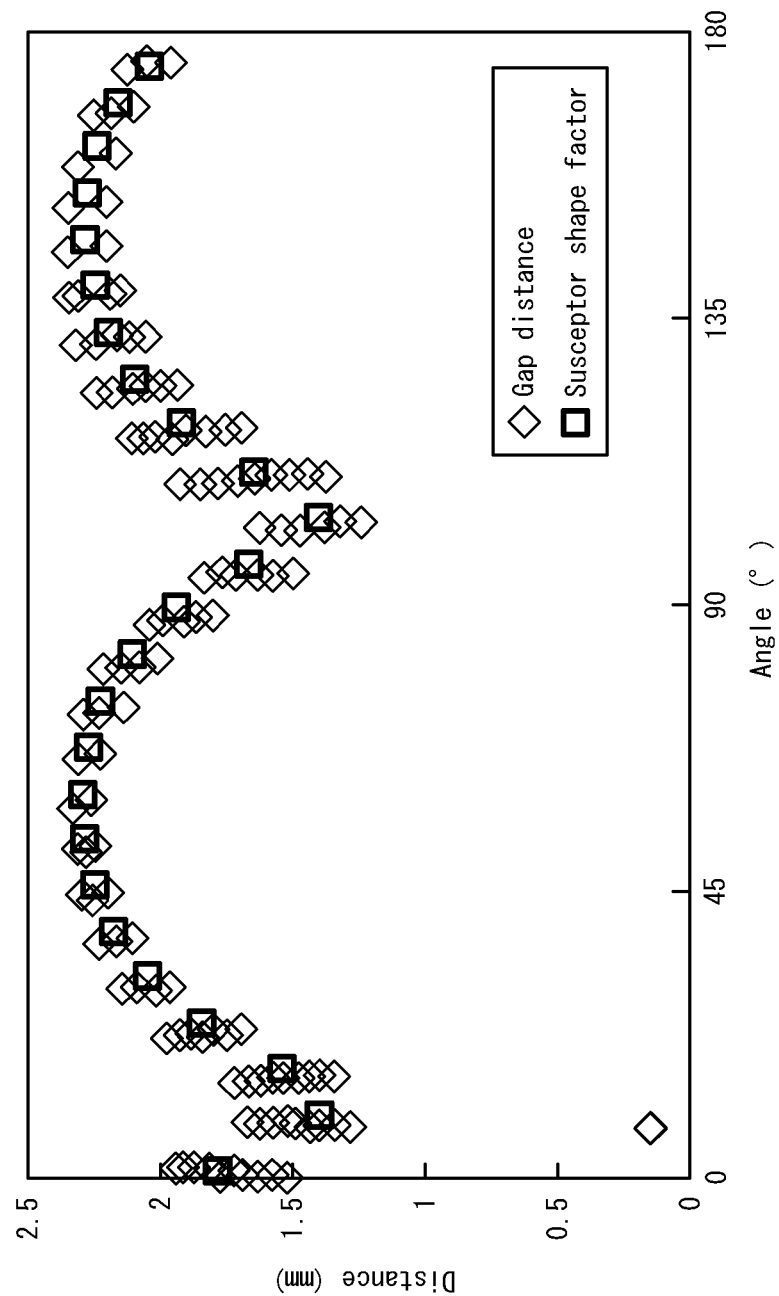
FIG. 9A is an example illustrating a periodic function of a susceptor shape factor obtained according to the second embodiment.

Semiconductor Wafer Placement Position Determination Method of Second Embodiment When N is an even number, that is, when the susceptor has a symmetric shape with respect to an even number of rotations (for example, 2-fold symmetric, 4-fold symmetric, 6-fold symmetric) with respect to the center Cs as a central axis, the susceptor shape factor resulting from variation of the radial distance L can be obtained from the average of the gap distances $L_p$ of 180° periods. Since the susceptor and the semiconductor wafer is rotated 360° in 1 period, averaging the gap distances $L_p$ of 180° periods compensates the effect of the position deviation G on the gap distance $L_p$. A specific example of this calculation is depicted in the graph of FIG. 9A.

Period regression analysis is performed directly on the variation of the gap distance $L_p$ in the first calculation step in the first embodiment; alternatively, in this second embodiment, a correction gap distance Lc is sought by subtracting the susceptor shape factor resulting from variation of the radial distance L (see FIG. 7). Here, period regression analysis is performed based on the correction gap distance Lc, thereby perceiving the variation in accordance with a trigonometric function in which a 360° rotation period of the susceptor is 1 period. This period regression analysis may be performed by fitting with a trigonometric function in which a 360° rotation period of the susceptor is 1 period as in the first embodiment. Further, the resultant amplitude of the trigonometric function is used in the subsequent second step as in the first embodiment.

Specifically, referring to the reference numerals in FIG. 5A to 5C, the method of determining a placement position of the semiconductor wafer according to the second embodiment includes: a measurement step of measuring, while rotating at least once the susceptor 100 on which the semiconductor wafer W is placed, a gap distance between a radially outer end surface of the semiconductor wafer W at a predetermined position in the circumferential direction and the opening edge 110C; a first calculation step of performing, based on variation of a correction gap distance obtained by subtracting a susceptor shape factor resulting from the variation of the radial distance L from the variation of the gap distance $L_p$ obtained by the measurement step, period regression analysis in which a rotation period of the susceptor 100 is 1 period; and a second calculation step of obtaining the position deviation G based on an amplitude of a trigonometric function obtained by the first calculation step. Subsequently, the susceptor shape factor resulting from the variation of the radial distance L is sought from the average of the gap distances $L_p$ of 180° periods.

Unlike in the first embodiment, period regression analysis is performed without using the susceptor shape factor in this embodiment, so that the position deviation G can preferably be obtained more accurately in this embodiment.

Figure 9B:
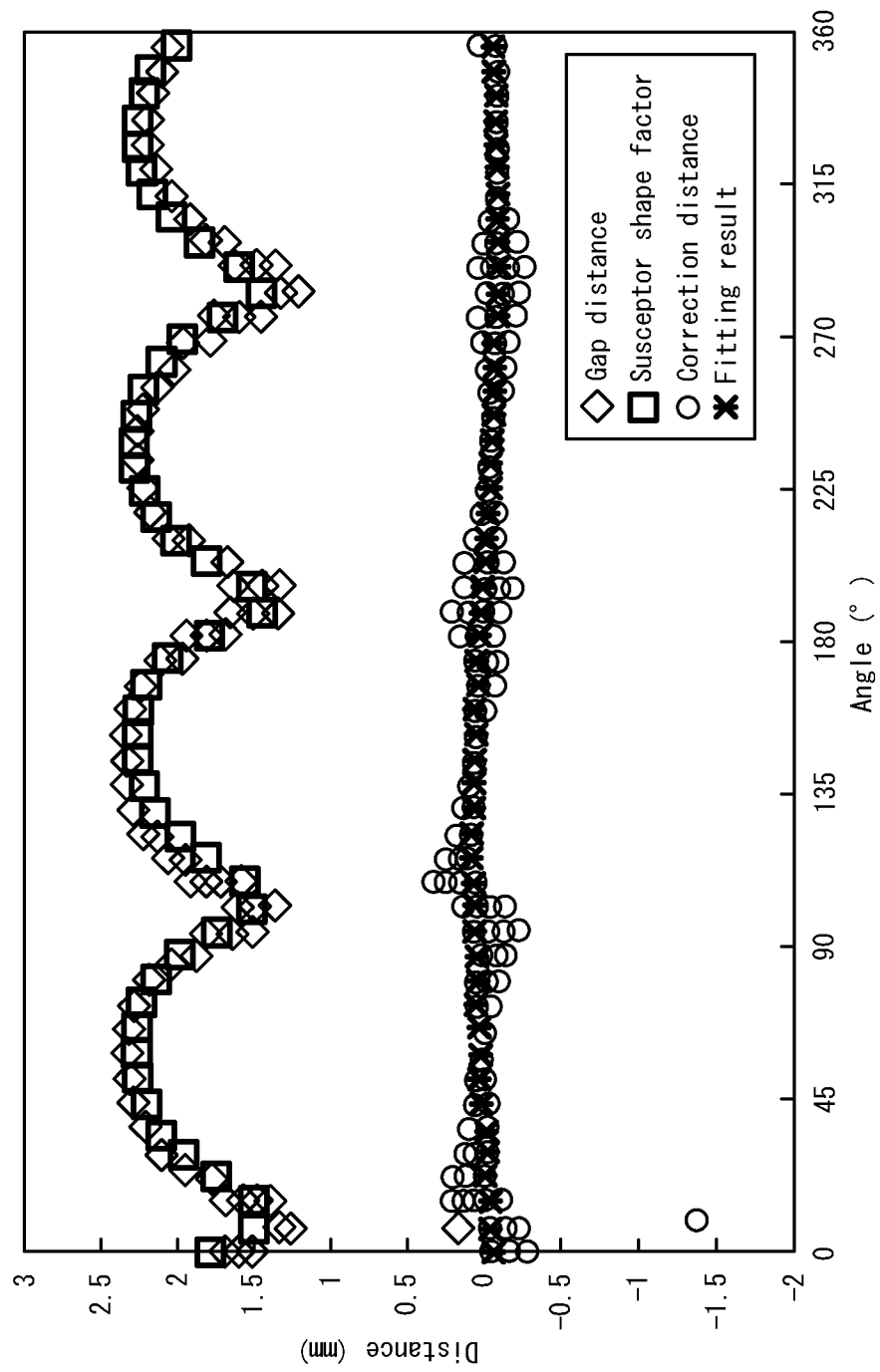
FIG. 9B is an example illustrating a trigonometric function obtained according to the second embodiment.

Here, FIG. 9A is a graph depicting a specific example of a susceptor shape factor obtained in the second embodiment in the case where the 4-fold symmetric susceptor 100 described above is used. In the graph of FIG. 9A, the gap distances $L_p$ of 180° periods (for example, 0° and 180°, 30° and 210°, etc.) are shown in an overlapping manner and the susceptor shape factor is the average of the gap distances $L_p$ of 180° periods. FIG. 9B depicts the correction gap distance Lc obtained by subtracting the susceptor shape factor from the gap distance $L_p$. Also depicted are the results obtained by further fitting with a trigonometric function based on the correction gap distance Lc ("fitting results" in FIG. 9B). In this second embodiment, since the amplitude of the trigonometric function resulting from the position deviation between the centers: the center Cw and the center Cs is 82.37 µm, the position deviation G of the gap distance $L_p$ is also determined to be 82.37 µm. Note that as in FIG. 8, the measurement time is converted into a rotation angle of the susceptor in FIG. 9A and FIG. 9B.

In seeking the susceptor shape factor resulting from variation of the radial distance L, the gap distance $L_p$ can still be adequately calculated when the measurement result of a rotation (360°) of the susceptor 100 is obtained; however, the calculation accuracy is naturally higher when measurement results of a plurality of rotations are used.

Here, the sampling rate (frame rate) of a typical CCD camera used in the measurement unit 155 is 30 fps, in which case, the second embodiment can be successfully applied when the rotation speed of the susceptor is around 10 rpm to 100 rpm, preferably 70 rpm or less. By contrast, for example in cases where the rotation speed of the susceptor is excessively high relative to the sampling rate at which the gap distance $L_p$ is acquired by the measurement unit 155, a sufficiently accurate susceptor shape factor is preferably acquired in advance through slow rotation. This is because a susceptor shape factor is uniquely determined depending on the susceptor shape. A correction gap distance Lc is preferably sought by subtracting the susceptor shape factor determined through slow rotation from the gap distance $L_p$ measured by actual fast rotation. Further, it is preferred that since the results become discrete (value abruptly changes) at joints between the repeating shapes in the susceptor, the shape of the susceptor including the joint portions is preferably measured accurately to ensure measurement accuracy at the joints more reliably. Accordingly, the frame rate of the measurement unit 155 is preferably high enough relative to the rotation speed of the susceptor.

Semiconductor Wafer Placement Position Determination Method of Third Embodiment

In the second embodiment, a susceptor shape factor is sought based on variation of the gap distance $L_p$; alternatively, the susceptor shape factor may be sought based on a design value or a measured value of the shape of the susceptor (see FIG. 7). The second step is the same as in the second embodiment described above. The second embodiment can be applied when the susceptor is symmetric with respect to an even number of rotations, whereas there is no such limitation in this embodiment and this embodiment can be applied even when the susceptor is symmetric with respect to an odd number of rotations. Note that the measured value of the shape of the susceptor is obtained by a measurement on the susceptor being taken out of the epitaxial growth apparatus using a commercially available contour measuring system, a commercially available three-dimensional measurement system, etc.

Specific aspects applicable to the first embodiment to the third embodiment will be described below; however, it should naturally be understood that this disclosure is not limited to those specific examples.

For the semiconductor wafer used in the first embodiment to the third embodiment described above, a silicon wafer is preferably used. Alternatively, a semiconductor wafer on which epitaxial growth is performed, for example, a SiC wafer, a sapphire wafer, or a compound semiconductor wafer can be used. Further, the diameter of the semiconductor wafer is not limited, and semiconductor wafers having different diameters, for example, 150 mm, 200 mm, 300 mm, and 450 mm can be applied. Since position deviation of the placement position of semiconductor wafers having a larger diameter can more easily be a problem, the first embodiment to the third embodiment are preferably applied to semiconductor wafers having a diameter of 300 mm or more.

As a material of the susceptor, a carbon substrate having a surface coated with silicon carbide (SiC) is typically used in order to reduce contamination from the susceptor when an epitaxial film is formed. Alternatively, the whole susceptor may be formed from SiC, or the susceptor may be formed to contain other materials inside as long as the susceptor surface is coated with SiC. In another preferred aspect, the susceptor surface is coated with a silicon film. This can prevent contamination from the susceptor into the epitaxial film.

In FIG. 5B and FIG. 5C, a ledge portion 110L where the susceptor 100 and the silicon wafer W are in contact with one another is depicted as a tapered inclined surface. This aspect is one of preferred aspects since the contact between the silicon wafer W and the susceptor is a point contact, resulting in small contact area. On the other hand, a portion where the susceptor 100 and the silicon wafer W are in contact with one another (ledge portion) is not necessarily an inclined surface but may be a horizontal surface. In this case, the contact between the horizontal surface and the silicon wafer W is a surface contact, which supports the silicon wafer W. When the radial distance L periodically varies, the ledge portion may have a given shape.

Further, in the susceptor 100, a bottom surface 110B of the counterbore portion is typically provided with a lift pin hole (not shown) for raising and lowering the silicon wafer W by sliding a lift pin through the hole when the silicon wafer is placed. Further, a through hole(s) extending from the bottom surface 110B to the back surface of the susceptor 100 may be provided at one or more points. Such a through hole is useful in discharging a gas between the susceptor and the silicon wafer to the back surface side of the susceptor when the silicon wafer W is loaded on the counterbore portion of the susceptor.

(Semiconductor Epitaxial Wafer Production Method)

Further, a method of producing a semiconductor epitaxial wafer according to this disclosure includes the steps of: determining the position deviation using the semiconductor wafer placement position determination method according to one of the first embodiment to the third embodiment described above; adjusting the placement position of the semiconductor wafer so that the obtained position deviation is fed back so that the position deviation is reduced, placing another semiconductor wafer at the adjusted placement position, and forming an epitaxial layer on a surface of the another semiconductor wafer using the epitaxial growth apparatus.

Note that in the step of adjusting the placement position, for example, a transfer position of a transfer robot may be adjusted. Further, typical growth conditions can be used in forming the epitaxial layer on the surface of the semiconductor wafer. In the case where a silicon epitaxial layer is formed on a silicon wafer, for example, a source gas such as dichlorosilane or trichlorosilane is introduced into an epitaxial growth reactor using hydrogen as a carrier gas, and the epitaxial growth on the semiconductor wafer can be performed by CVD at a temperature in the range of approximately 1000° C. to 1200° C. although the growth temperature also depends on the source gas used. The thickness of the epitaxial layer can be in the range of 1 μm to 15 μm.

Note that the step of determining the position deviation may be performed on one semiconductor wafer, and the placement position may be adjusted each time the next semiconductor wafer is transferred into the epitaxial growth apparatus. Alternatively, the step of determining the position deviation may be performed on a plurality of semiconductor wafers (for example 25 wafers per batch), and the placement position may be adjusted after completing one batch. Further, the position deviation is preferably adjusted to 0.7 mm or less, more preferably adjusted to 0.4 mm or less.

The semiconductor epitaxial silicon wafer production method of this embodiment is also useful in terms of increasing uniformity of an epitaxial layer to be formed, since the position deviation of the placement position can be reduced.

EXAMPLES

Example 1

A silicon wafer having a diameter of 300 mm was placed on the 4-fold symmetric susceptor schematically depicted in FIG. 5A to FIG. 5B. A CCD camera provided with a sheath for avoiding the effect of the temperature was placed as a measurement unit 155 of the epitaxial growth apparatus 150 (see FIG. 1) above a lamp. The sampling rate of the CCD camera for measuring the gap distance $L_p$ was 30 fps.

When the silicon wafer was introduced into an epitaxial film formation chamber, the silicon wafer was transferred to the susceptor using a transfer robot and was placed on the susceptor using a lift pin. Subsequently, hydrogen gas was supplied at 1130° C., and the gap distance $L_p$ was measured using the measurement unit 155 while rotating the susceptor at a speed of 20 rpm during hydrogen bake-out. The rotation speed of the susceptor was set back at 1130° C. to a value desired for epitaxial film thickness control, and a silicon epitaxial film was grown. Trichlorosilane gas was used as a raw material source gas, diborane gas as a dopant gas, and hydrogen gas as a carrier gas.

Figure 10A:
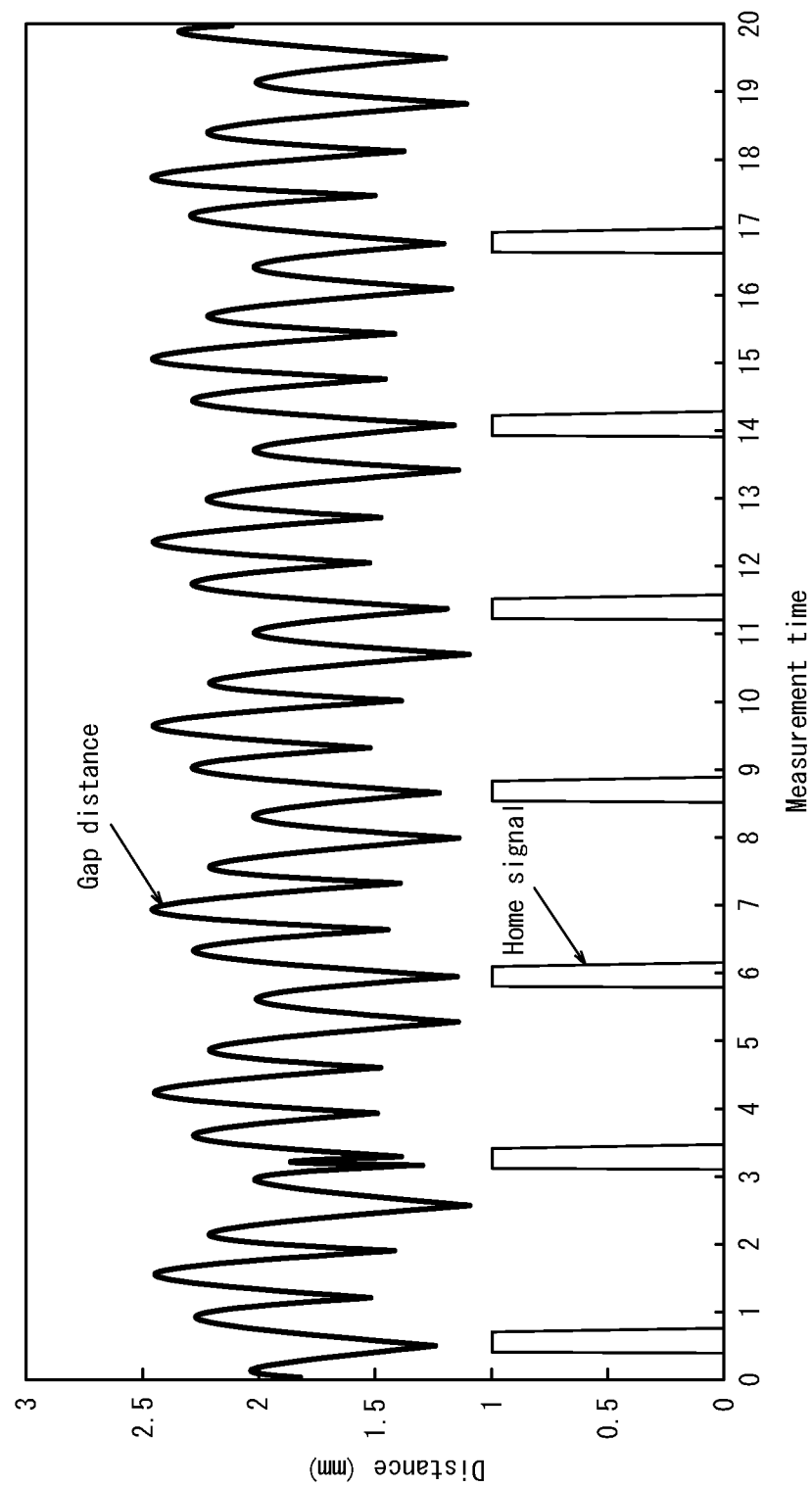
FIG. 10A is a graph depicting the gap distance measured in Example 1.

The obtained results are presented in FIG. 10A. FIG. 10A also depicts a home signal indicating detection of a notch position of the silicon wafer. It is also similar for FIG. 11A, FIGS. 12A, and 13A.

Figure 10C:
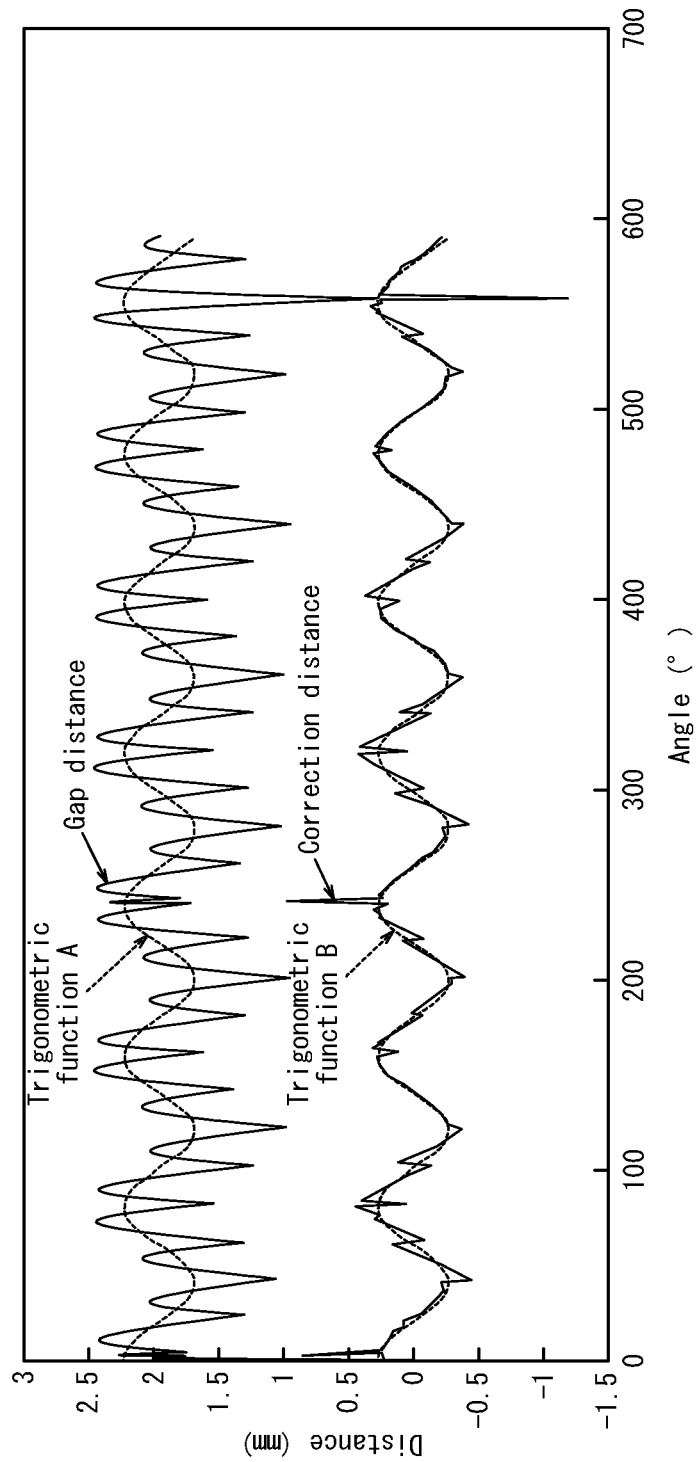
FIG. 10C is a graph depicting two trigonometric functions obtained in Example 1.

Trigonometric function fitting was performed directly on the gap distance $L_p$ in accordance with the first embodiment. The results are also depicted as a trigonometric function A in FIG. 10C. Based on the resultant amplitude of the trigonometric function A, the position deviation G was 0.540 mm.

Further, the resultant distance $L_p$ was converted into distances of 180° periods and the average was calculated in accordance with the second embodiment to seek a susceptor shape factor. The results are presented in FIG. 10B. The correction gap distance Lc was calculated by subtracting the susceptor shape factor from the gap distance $L_p$. The results are presented in FIG. 10C. Further, trigonometric function fitting was performed based on the correction gap distance Lc. The results are depicted as a trigonometric function B in FIG. 10C. Based on the resultant amplitude of the trigonometric function B, the position deviation G was 0.562 mm.

Example 2

Figure 11A:
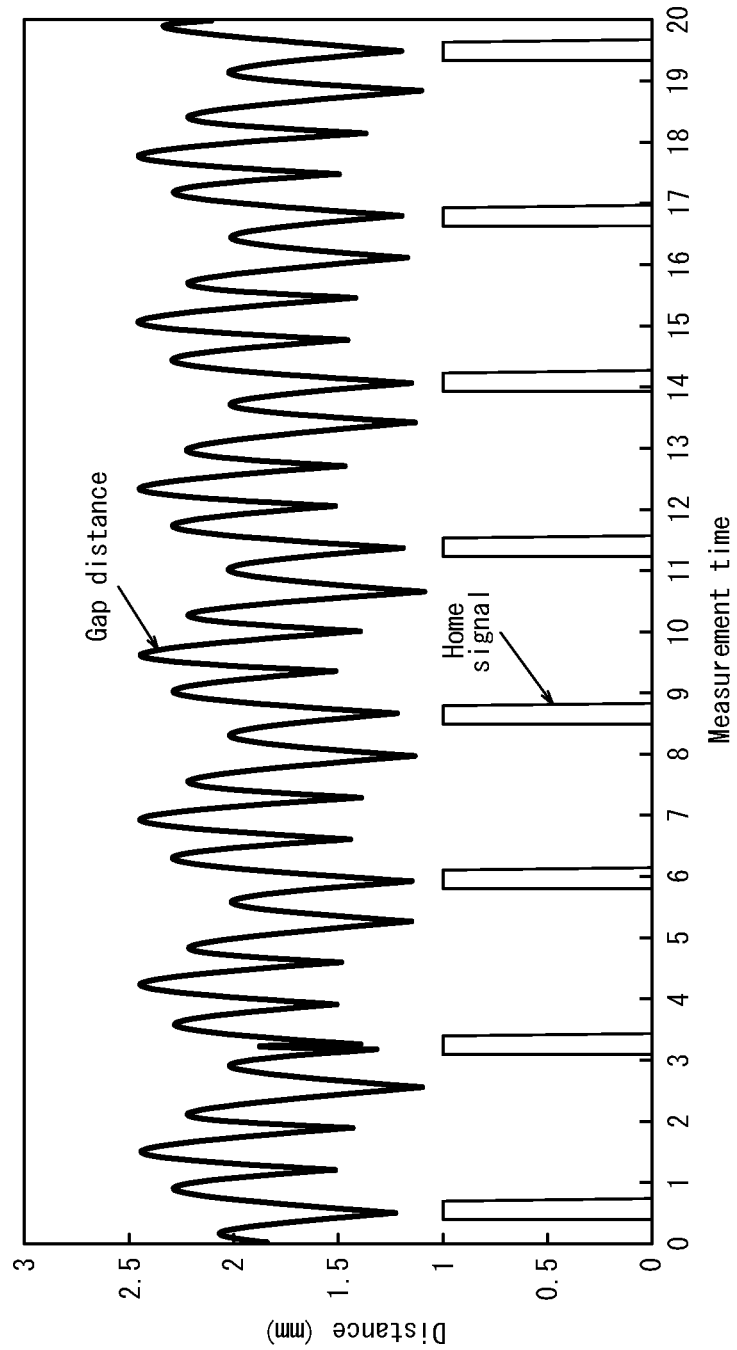
FIG. 11A is a graph depicting the gap distance measured in Example 2.
Figure 11B:
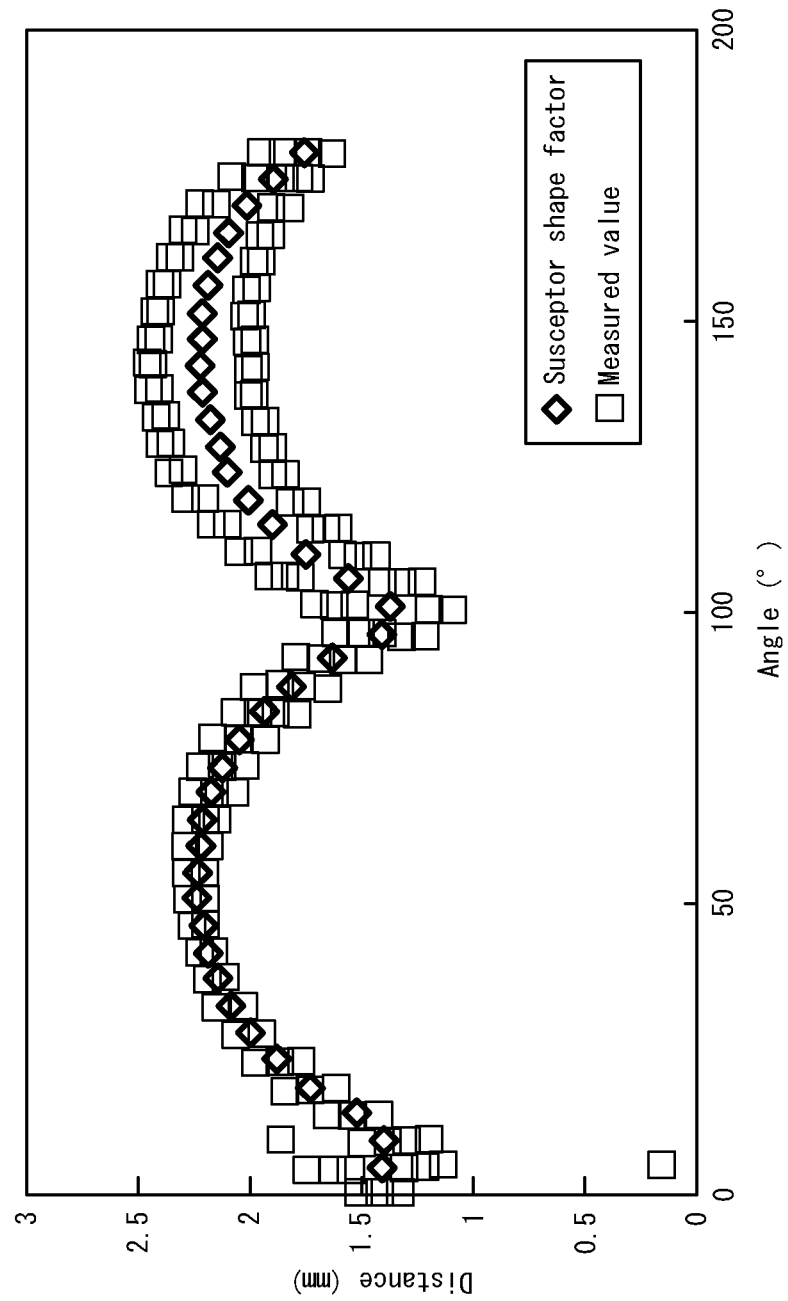
FIG. 11B depicts a periodic function of a susceptor shape factor obtained in Example 2.
Figure 11C:
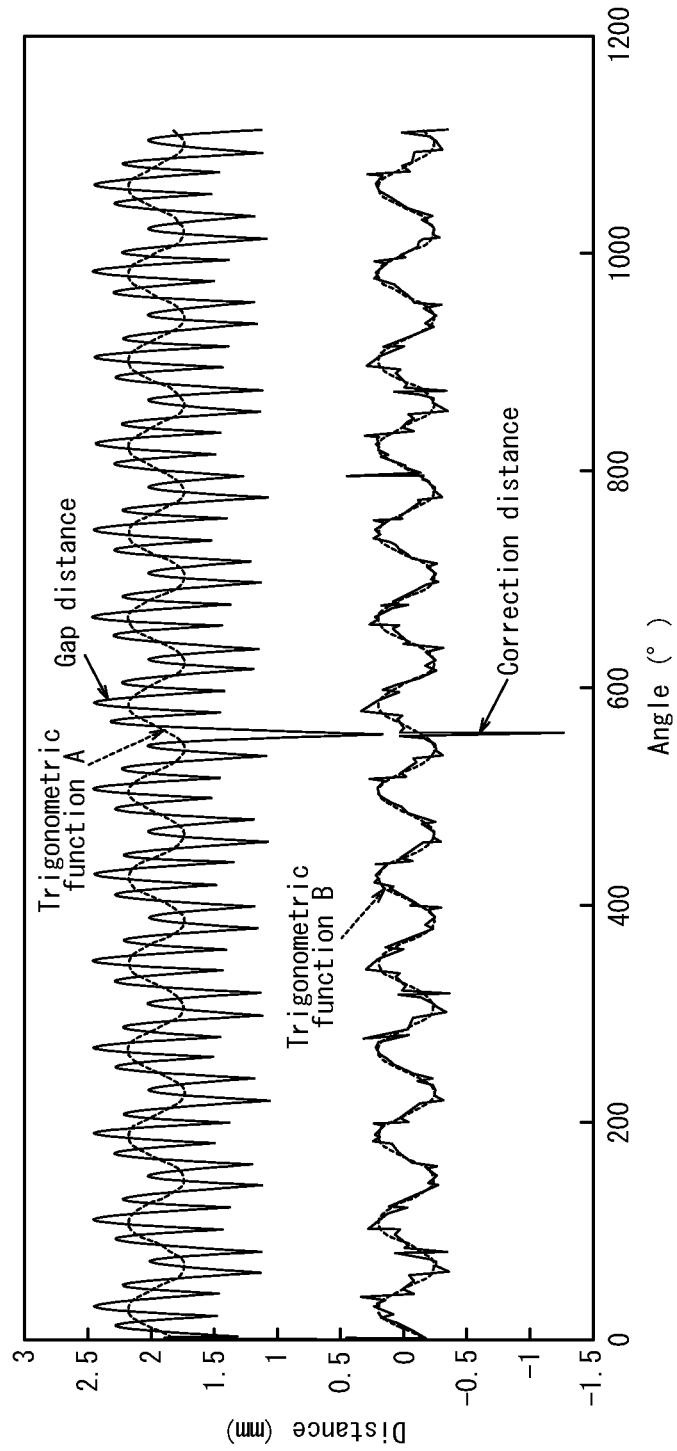
FIG. 11C is a graph depicting two trigonometric functions obtained in Example 2.

As with Example 1, a silicon wafer was introduced into the epitaxial film formation chamber, and variation of the gap distance $L_p$ was measured while rotating the susceptor at 20 rpm. As in Example 1, the trigonometric function A according to the first embodiment and the trigonometric function B according to the second embodiment were determined. FIG. 11A to FIG. 11C present the results including the calculation results of the susceptor shape factor. The position deviation G based on the amplitude of the resultant trigonometric function A was 0.439 mm, and the position deviation G based on the amplitude of the resultant trigonometric function B was 0.427 mm.

Example 3

Figure 12A:
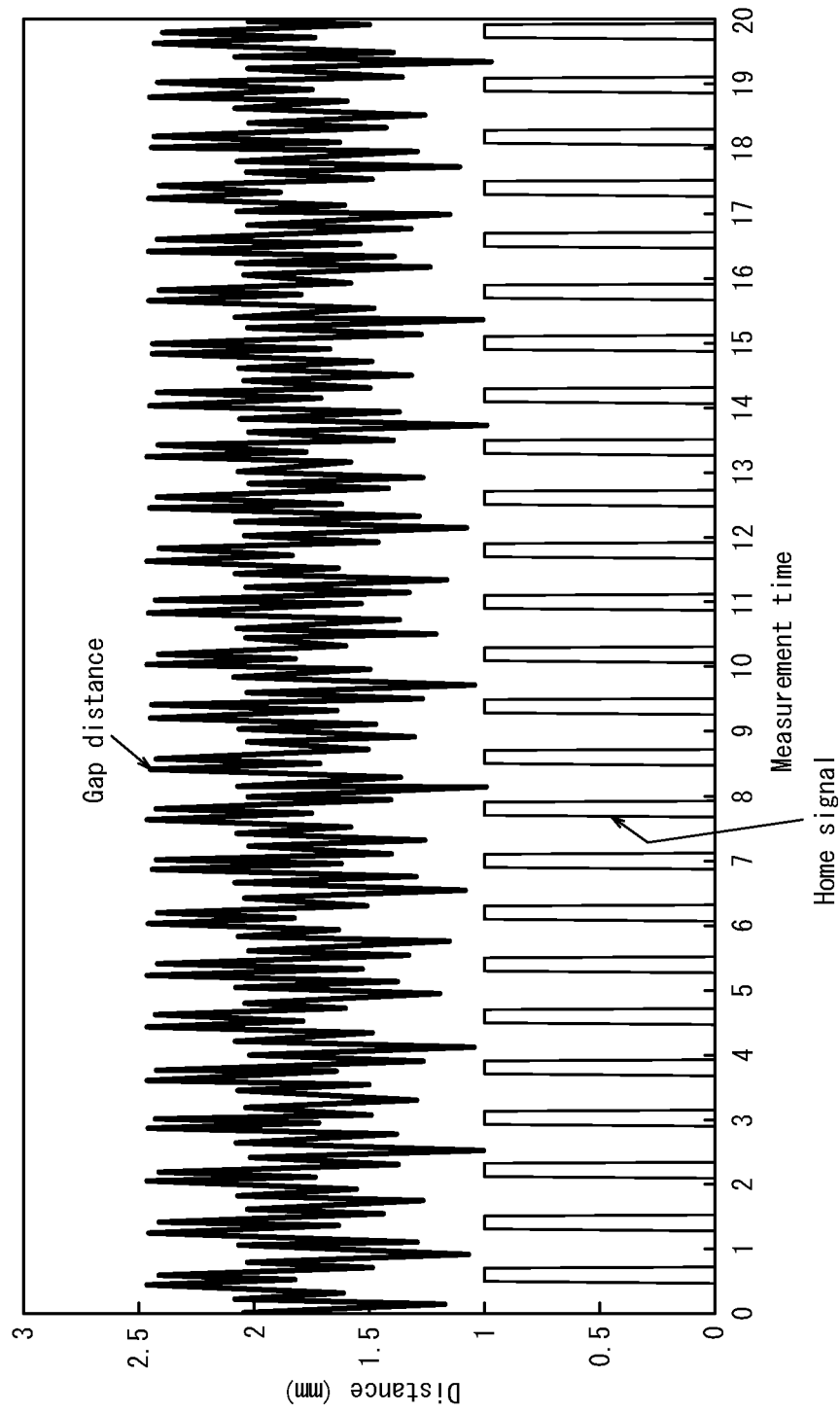
FIG. 12A is a graph depicting the gap distance measured in Example 3.
Figure 12B:
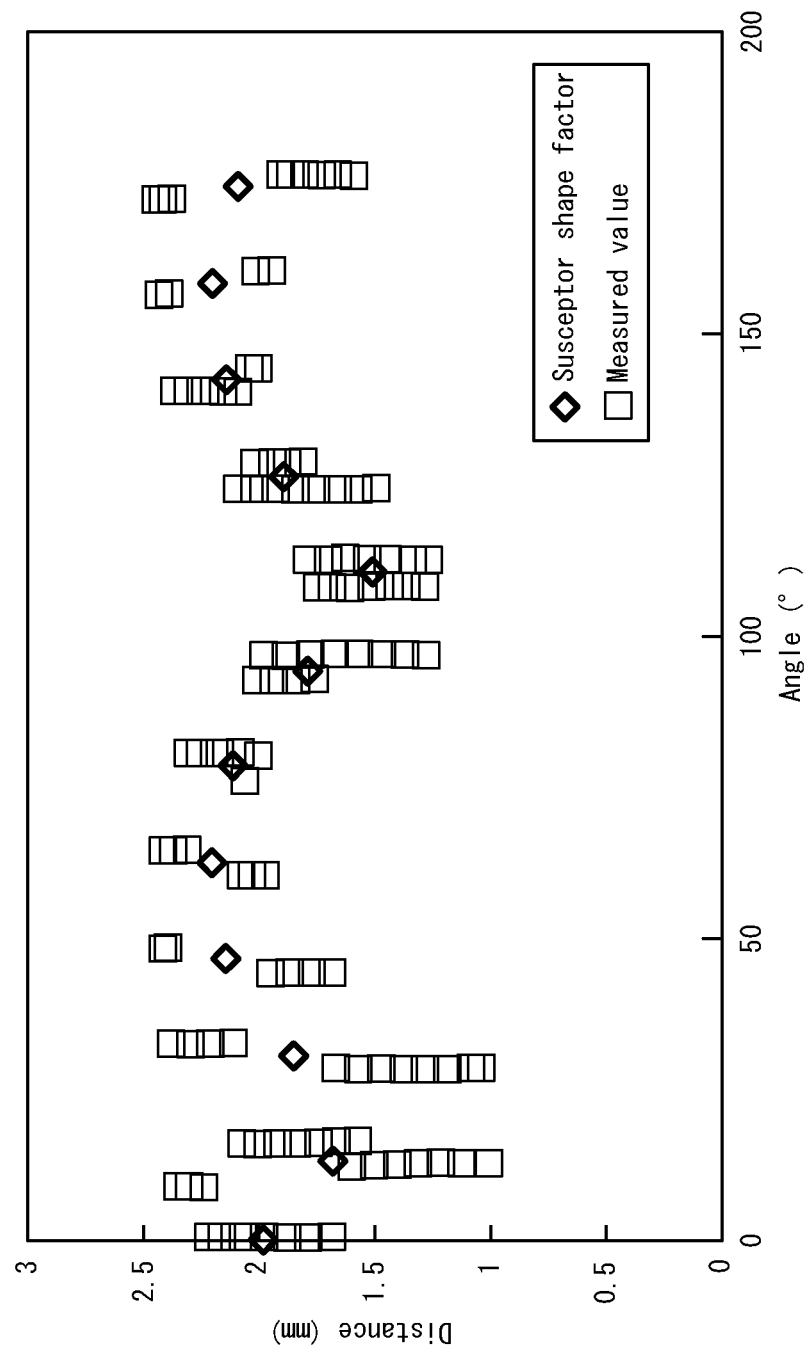
FIG. 12B depicts a periodic function of a susceptor shape factor obtained in Example 3.
Figure 12C:
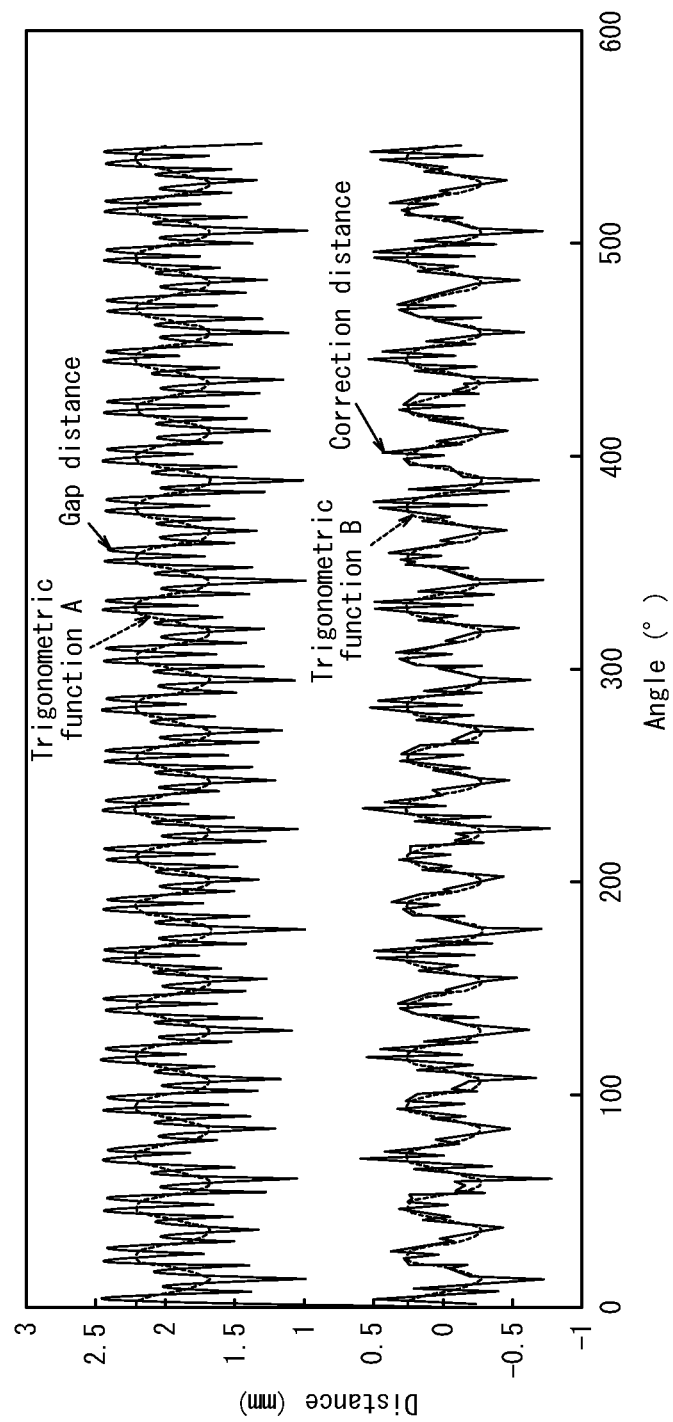
FIG. 12C is a graph depicting two trigonometric functions obtained in Example 3.

As with Example 1, a silicon wafer was introduced into the epitaxial film formation chamber, and variation of the gap distance $L_p$ was measured while rotating the susceptor at 70 rpm. As in Example 1, the trigonometric function A according to the first embodiment and the trigonometric function B according to the second embodiment were determined. FIG. 12A to FIG. 12C present the results including the calculation results of the susceptor shape factor. The position deviation G based on the amplitude of the resultant trigonometric function A was 0.546 mm, and the position deviation G based on the amplitude of the resultant trigonometric function B was 0.546 mm.

Example 4

Figure 13A:
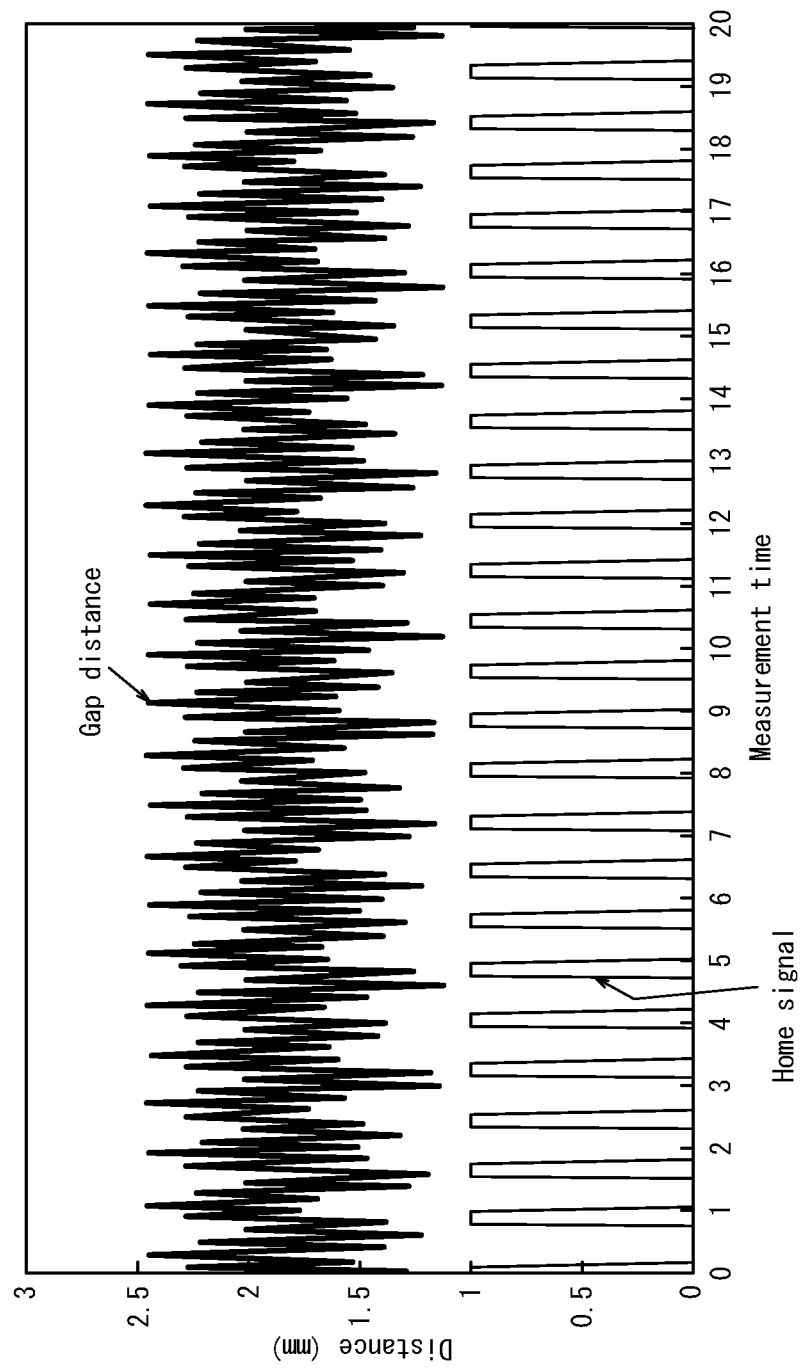
FIG. 13A is a graph depicting the gap distance measured in Example 4.
Figure 13B:
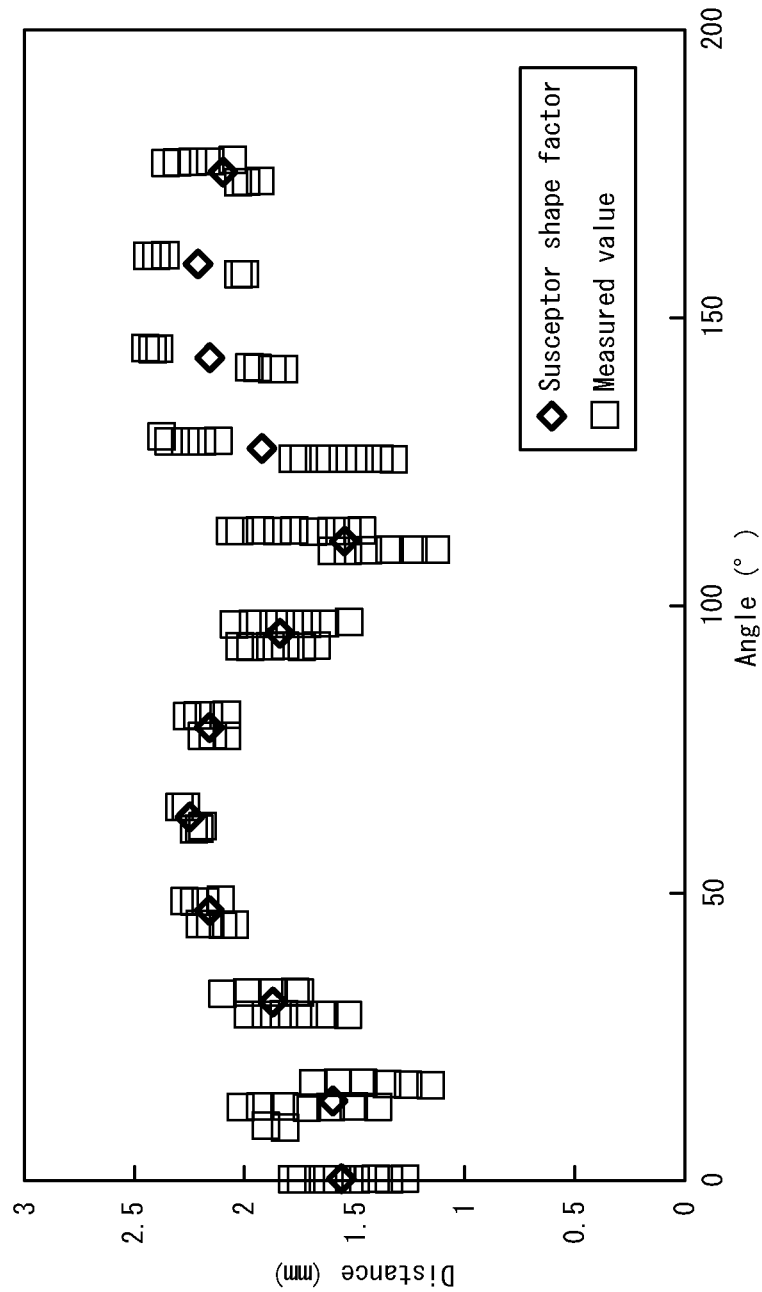
FIG. 13B depicts a periodic function of a susceptor shape factor obtained in Example 4.
Figure 13C:
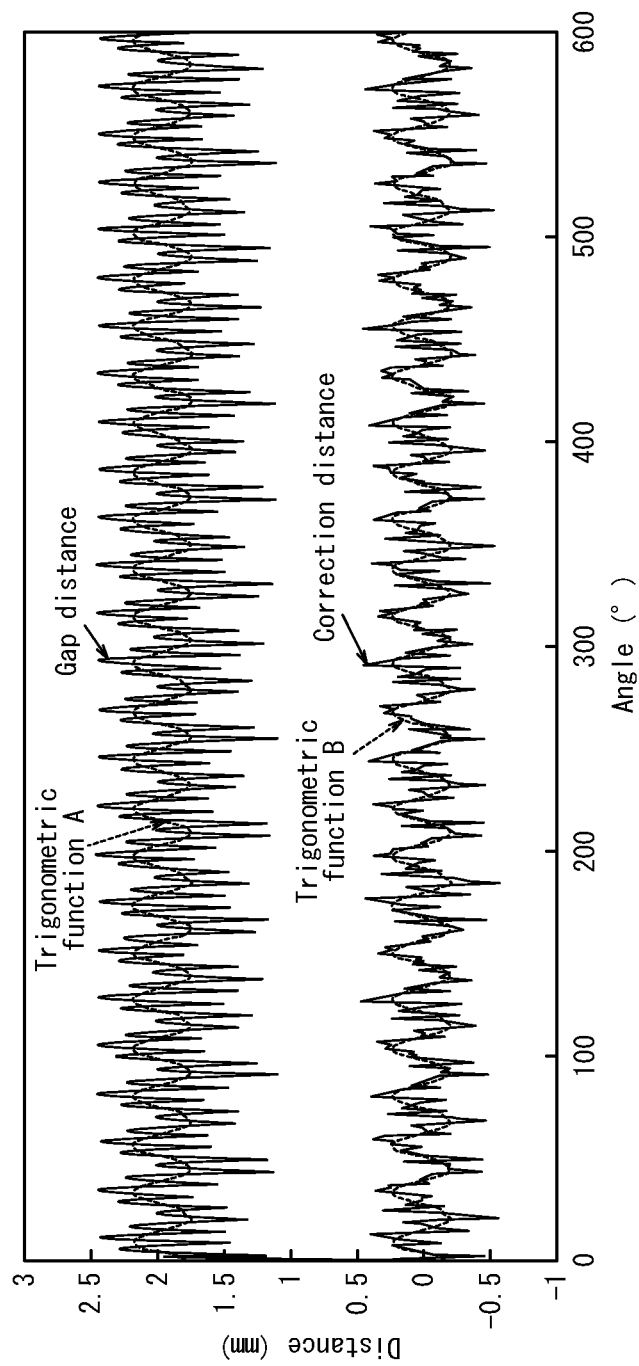
FIG. 13C is a graph depicting two trigonometric functions obtained in Example 4.

As with Example 1, a silicon wafer was introduced into the epitaxial film formation chamber, and variation of the gap distance $L_p$ was measured while rotating the susceptor at 70 rpm. As in Example 1, the trigonometric function A according to the first embodiment and the trigonometric function B according to the second embodiment were determined. FIG. 13A to FIG. 13C present the results including the calculation results of the susceptor shape factor. The position deviation G based on the amplitude of the resultant trigonometric function A was 0.444 mm, and the position deviation G based on the amplitude of the resultant trigonometric function B was 0.406 mm.

As described above, for each of Examples 1 to 4, it was confirmed that the position deviation of the placement position of the semiconductor wafer could be measured when using the 4-fold symmetric susceptor depicted in FIG. 5A to FIG. 5C.

INDUSTRIAL APPLICABILITY

This disclosure provides a semiconductor wafer placement position determination method which makes it possible to measure a position deviation at a placement position of a semiconductor wafer when using a susceptor that is N-fold symmetric with respect to the center of the susceptor as a rotation axis. Further, this disclosure provides a semiconductor epitaxial wafer production method using this semiconductor wafer placement position determination method.

REFERENCE SIGNS LIST 1, 100: Susceptor
11, 110: Counterbore portion
110A: Inner circumferential wall surface
110B: Bottom surface
110C: Opening edge
110L: Ledge portion
150: Epitaxial growth apparatus
151: Upper liner
152: Lower liner
153: Upper dome
154: Lower dome
155: Measurement unit
Cs: Susceptor center
Cw: Semiconductor wafer center
W: Silicon wafer
L: Radial distance between susceptor center and opening edge of counterbore
$L_p$: Gap distance

The invention claimed is:

1. A semiconductor wafer placement position determination method of measuring a position deviation of a center of a semiconductor wafer from a center of a susceptor that is disposed in an epitaxial growth apparatus and is provided with a concave counterbore portion and with an inner circumferential wall surface, the semiconductor wafer being placed in the counterbore portion of the susceptor,
  wherein a radial distance between the center of the susceptor and an opening edge of the counterbore portion varies in the circumferential direction, and the opening edge of the counterbore is N-fold symmetric with respect to the center of the susceptor as a rotation axis, where N is an integer equal to or more than 2,
  the semiconductor wafer placement position determination method comprises:
    measuring, while rotating at least once the susceptor on which the semiconductor wafer is placed, a gap distance between a periphery of the semiconductor wafer at a predetermined position in the circumferential direction and the opening edge to obtain a measured gap distance;
    performing, based on a correction gap distance obtained by subtracting a susceptor shape factor resulting from a variation of the radial distance from a variation of the measured gap distance, period regression analysis in which a rotation period of the susceptor is 1 period; and
    a second calculation step of determining the position deviation based on an amplitude of a trigonometric function obtained by the period regression analysis.

2. The semiconductor wafer placement position determination method according to claim 1, wherein the number N is an even number, and the susceptor shape factor is obtained from an average of the gap distances of 180° periods.

3. The semiconductor wafer placement position determination method according to claim 1, wherein the susceptor shape factor is obtained based on a design value or a measured value of a shape of the susceptor.

4. A semiconductor epitaxial wafer production method, comprising:
    determining the position deviation using the semiconductor wafer placement position determination method according to claim 1;
    adjusting the placement position of the semiconductor wafer so that the obtained position deviation is fed back so that the position deviation is reduced,
    placing an other semiconductor wafer at the adjusted placement position, and
    forming an epitaxial layer on a surface of the other semiconductor wafer using the epitaxial growth apparatus.

5. A semiconductor epitaxial wafer production method, comprising:
- determining the position deviation using the semiconductor wafer placement position determination method according to claim 2;
- adjusting the placement position of the semiconductor wafer so that the obtained position deviation is fed back so that the position deviation is reduced,
- placing an other semiconductor wafer at the adjusted placement position, and
- forming an epitaxial layer on a surface of the other semiconductor wafer using the epitaxial growth apparatus.

6. A semiconductor epitaxial wafer production method, comprising:
- determining the position deviation using the semiconductor wafer placement position determination method according to claim 3;
- adjusting the placement position of the semiconductor wafer so that the obtained position deviation is fed back so that the position deviation is reduced,
- placing an other semiconductor wafer at the adjusted placement position, and
- forming an epitaxial layer on a surface of the other semiconductor wafer using the epitaxial growth apparatus.

\* \* \* \* \*